(12) United States Patent
Ogihara et al.

(10) Patent No.: US 7,122,834 B2
(45) Date of Patent: Oct. 17, 2006

(54) SEMICONDUCTOR APPARATUS HAVING ADHESION LAYER AND SEMICONDUCTOR THIN FILM

(75) Inventors: Mitsuhiko Ogihara, Hachioji (JP);
Hiroyuki Fujiwara, Hachioji (JP);
Masaaki Sakuta, Tokyo (JP);
Ichimatsu Abiko, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 10/734,676

(22) Filed: Dec. 15, 2003

(65) Prior Publication Data

US 2004/0130015 A1  Jul. 8, 2004

(30) Foreign Application Priority Data

Dec. 25, 2002  (JP) .............................. 2002-373882

(51) Int. Cl.
*H01L 33/00* (2006.01)

(52) U.S. Cl. ............................ 257/67; 257/81; 257/82; 257/93; 257/783

(58) Field of Classification Search .................. 257/81, 257/82, 84, 93, 98, 99, 693, 700, 701, 783, 257/67

See application file for complete search history.

(56) References Cited

U.S. PATENT DOCUMENTS

| | | | | |
|---|---|---|---|---|
| 5,081,513 A | * | 1/1992 | Jackson et al. | 257/57 |
| 5,211,761 A | * | 5/1993 | Noguchi et al. | 136/258 |
| 6,232,142 B1 | * | 5/2001 | Yasukawa | 438/69 |
| 6,429,070 B1 | * | 8/2002 | Gonzalez et al. | 438/253 |
| 6,603,146 B1 | * | 8/2003 | Hata et al. | 257/79 |
| 2002/0030197 A1 | * | 3/2002 | Sugawara et al. | 257/103 |
| 2002/0180861 A1 | * | 12/2002 | Fukasawa | 347/244 |

FOREIGN PATENT DOCUMENTS

JP   10-063807 A   6/1998

* cited by examiner

Primary Examiner—Stephen W. Smoot
(74) Attorney, Agent, or Firm—Rabin & Berdo, PC

(57) ABSTRACT

A semiconductor apparatus includes a substrate; an adhesion layer disposed on the substrate, the adhesion layer mainly consisting of semiconductor material; and at least one semiconductor thin film including at least one semiconductor device and bonded on the adhesion layer. The adhesion layer may be a polycrystalline silicon layer or an amorphous silicon layer.

18 Claims, 24 Drawing Sheets

SEMICONDUCTOR APPARATUS HAVING ADHESION LAYER AND SEMICONDUCTOR THIN FILM

BACKGROUND OF THE INVENTION

1. Field of the Invention

The present invention relates to a semiconductor apparatus useful in, for example, a light-emitting diode (LED) print head in an electrophotographic printer.

2. Description of the Related Art

FIG. 23 is a perspective view schematically showing a part of a conventional LED print unit, and FIG. 24 is a plan view showing a part of an LED array chip provided to the LED print unit of FIG. 23. Referring to FIG. 23, a conventional LED print unit 900 includes a circuit board 901 on which are mounted a plurality of LED array chips 902 having electrode pads 903, and a plurality of driving integrated circuit (IC) chips 904 having electrode pads 905. The electrode pads 903 and 905 are interconnected by bonding wires 906 through which current is supplied from the driving-IC chips 904 to LEDs 907 formed in the LED array chips 902. Further electrode pads 909 on the driving-IC chips 904 are connected to bonding pads 910 on the circuit board 901 by further bonding wires 911.

For reliable wire bonding, the electrode pads 903, 905, and 909 must be comparatively large, e.g., one hundred micrometers square (100 μm×100 μm), and the LED array chips 902 must have approximately the same thickness as the driving-IC chips 904 (typically 250–300 μm), even though the functional parts of the LED array chips 902 (the LEDs 907) have a depth of only about 5 μm from the surface. To accommodate the needs of wire bonding, an LED array chip 902 must therefore be much larger and thicker than necessary simply to accommodate the LEDs 907. These requirements drive up the size and material cost of the LED array chips 902.

As shown in plan view in FIG. 24, the electrode pads 903 may need to be arranged in a staggered formation on each LED array chip 902. This arrangement further increases the chip area and, by increasing the length of the path from some of the LEDs 907 to their electrode pads 903, increases the associated voltage drop.

The size of the driving-IC chips 904 also has to be increased to accommodate the large number of bonding pads 905 by which they are interconnected to the LED array chips 902.

Light-emitting elements having a thin-film structure are disclosed in Japanese Patent Laid-Open Publication No. 10-063807 (FIGS. 3–6, FIG. 8, and paragraph 0021), but these light-emitting elements have electrode pads for solder bumps through which current is supplied. An array of such light-emitting elements would occupy substantially the same area as a conventional LED array chip 902.

SUMMARY OF THE INVENTION

It is an object of the present invention to provide a semiconductor apparatus with a semiconductor having an adhesion layer and a semiconductor thin film that can reduce its size and material cost.

According to the present invention, a semiconductor apparatus includes a substrate; an adhesion layer disposed on the substrate, the adhesion layer mainly consisting of semiconductor material; and at least one semiconductor thin film including at least one semiconductor device and bonded on the adhesion layer. The adhesion layer may be a polycrystalline silicon layer or an amorphous silicon layer.

DETAILED DESCRIPTION OF THE INVENTION

Figure 1:
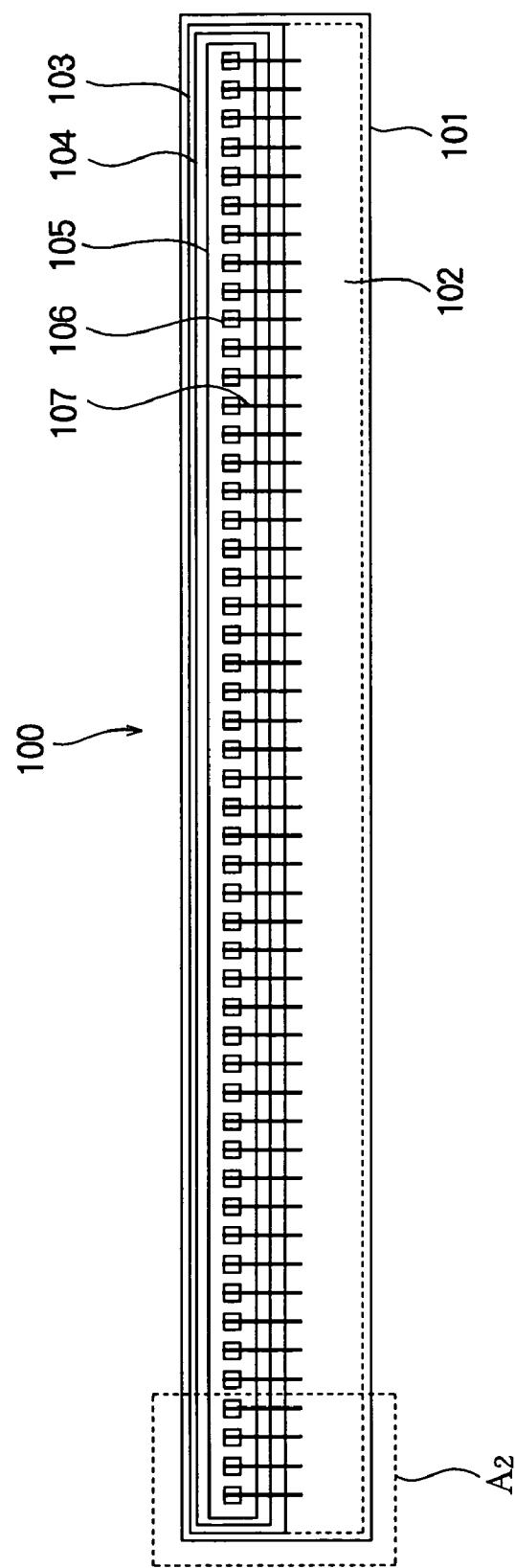
FIG. 1 is a plan view schematically showing an integrated LED/driving-IC chip in accordance with a first embodiment of the present invention.

Embodiments of the invention will now be described with reference to the attached drawings, in which like elements are indicated by like reference characters.

First Embodiment

Figure 2:
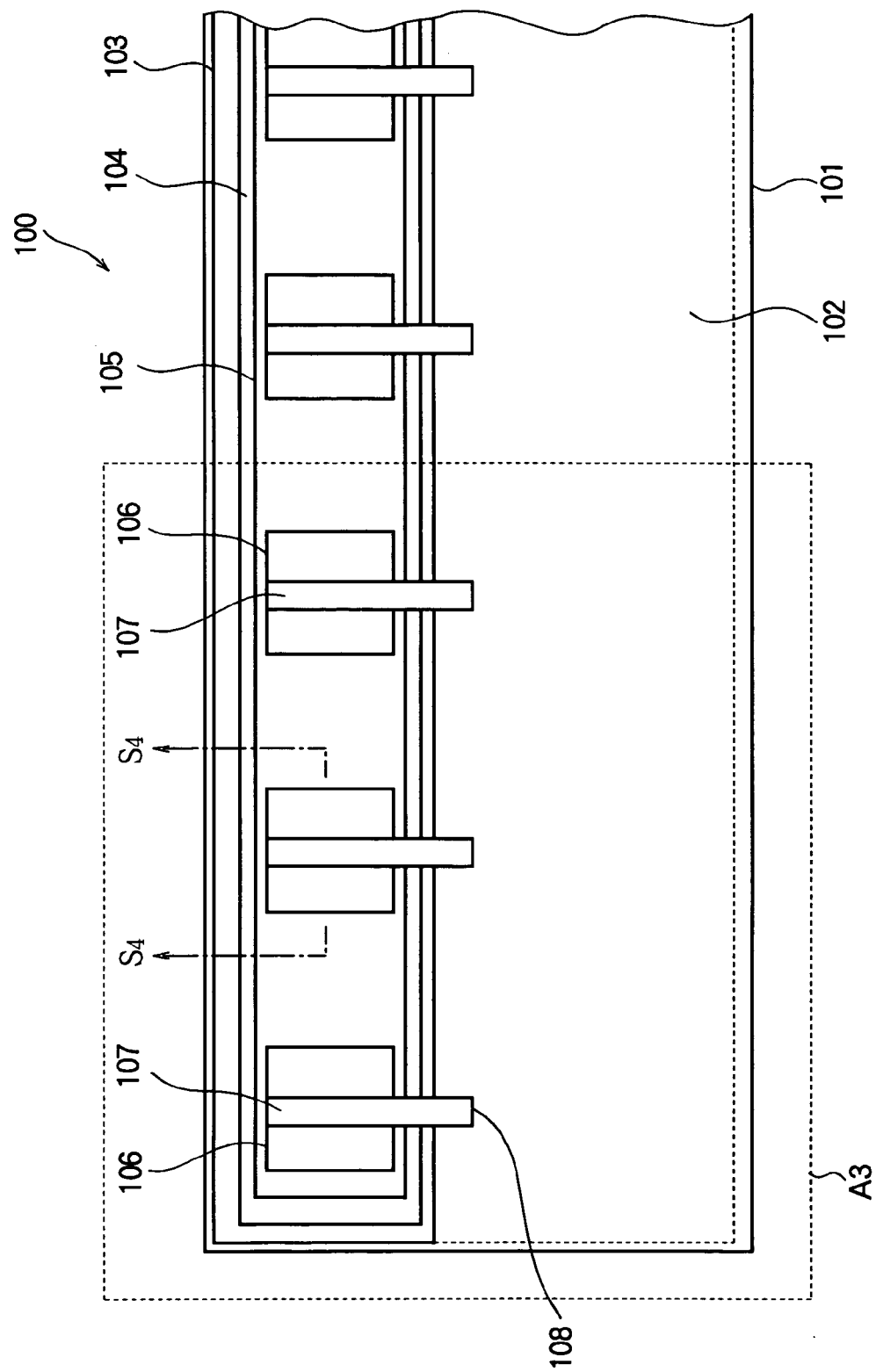
FIG. 2 is an enlarged plan view of a part $A_2$ in FIG. 1.
Figure 3:
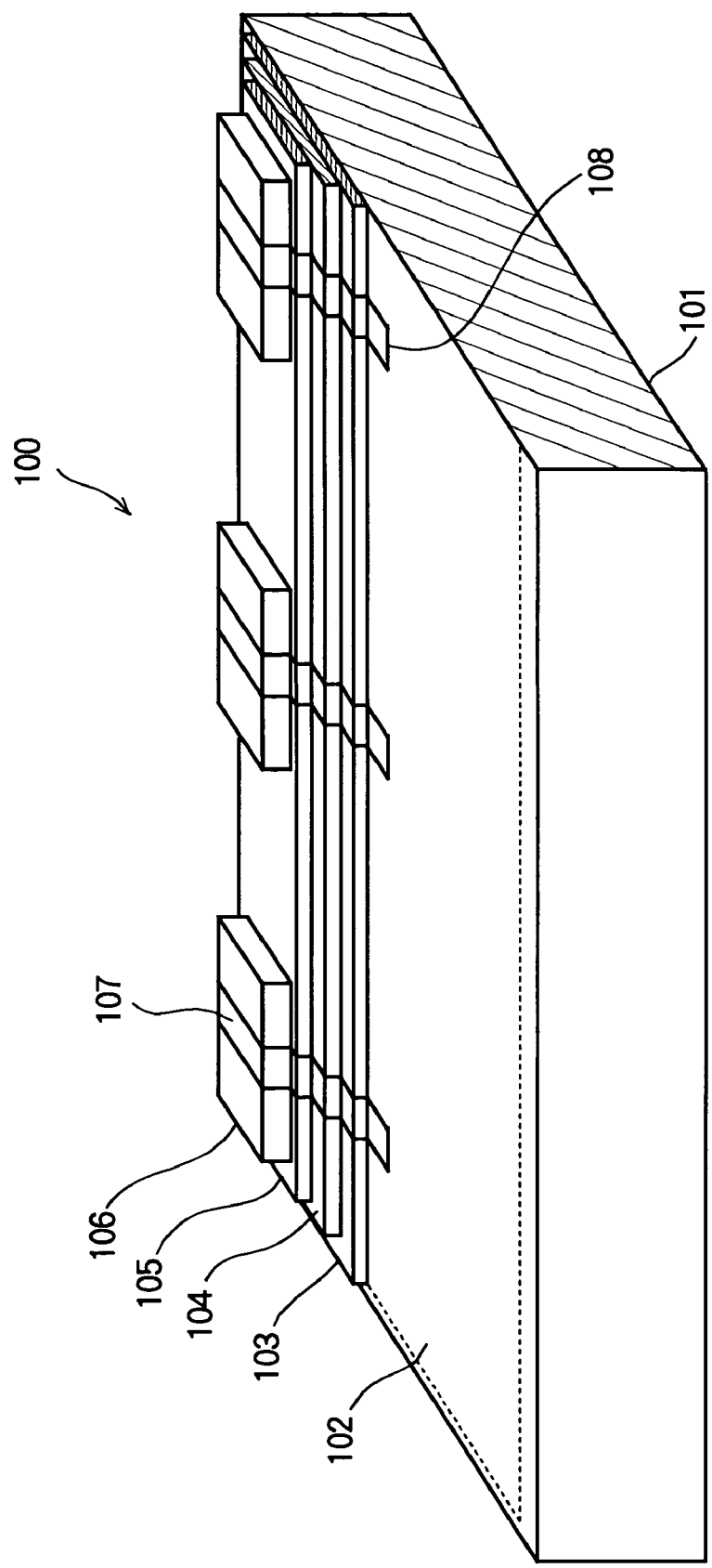
FIG. 3 is a schematic perspective view of a part $A_3$ in FIG. 2.
Figure 4:
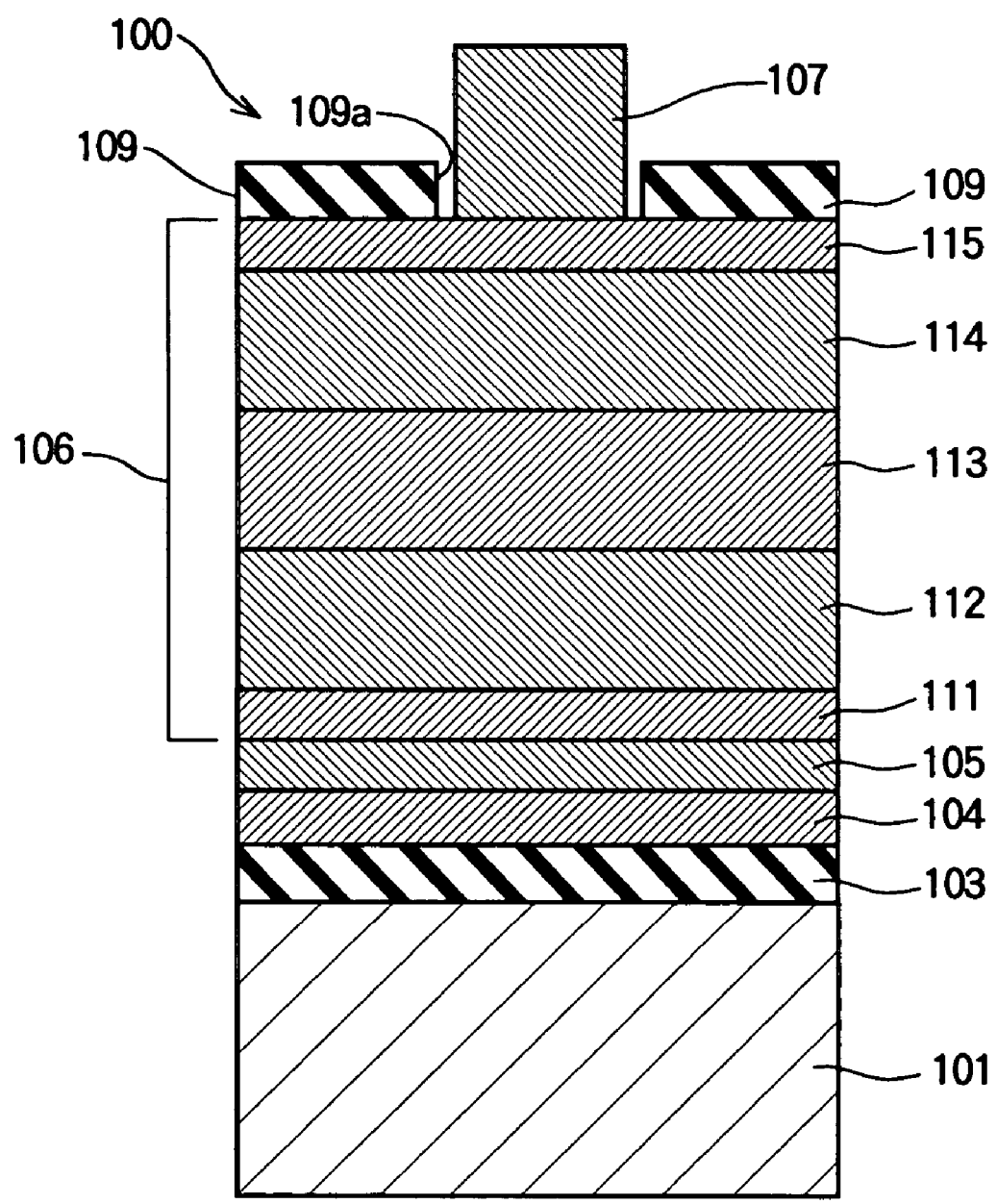
FIG. 4 is a schematic cross sectional view showing a cross section through line $S_4$—$S_4$ in FIG. 2.

FIG. 1 is a perspective view schematically showing an integrated LED/driving-IC chip 100 as a semiconductor apparatus in accordance with a first embodiment of the present invention, and FIG. 2 is an enlarged plan view of a part $A_2$ in FIG. 1. FIG. 3 is a perspective view schematically showing a part $A_3$, and FIG. 4 is a schematic cross sectional view showing a cross section through line $S_4$—$_4$ in FIG. 2.

As shown in FIGS. 1 to 4, an integrated LED/driving-IC chip 100 of the first embodiment includes a silicon (Si) substrate 101 having an integrated circuit 102, and a first interdielectric layer 103 formed on the Si substrate 101. The integrated LED/driving-IC chip 100 also includes an adhesion layer 104 formed on the first interdielectric layer 103. The adhesion layer 104 mainly consists of semiconductor material. The integrated LED/driving-IC chip 100 further includes an electrically conductive layer 105 formed on the adhesion layer 104, and a plurality of LED epitaxial films 106 as sheet-like semiconductor thin films bonded on the electrically conductive layer 105. The integrated LED/driving-IC chip 100 further includes thin individual interconnecting layers 107 formed in a region extending from upper surfaces of the LED epitaxial films 106 to the upper surfaces of individual terminal areas 108 of the integrated circuit 102. The thin individual interconnecting layers 107 electrically connects the LED epitaxial films 106 and the integrated circuit 102. The integrated LED/driving-IC chip 100 further includes a second interdielectric layer 109 (shown only in FIG. 4) for electrically isolating the individual interconnecting layers 107 from the LED epitaxial films 106 and part of the Si substrate 101. The second interdielectric layer 109 is disposed between the individual interconnecting layers 107 and the electrically conductive layer 105 and between the individual interconnecting layers 107 and the adhesion layer 104.

Each of the LED epitaxial films 106 may have a structure of suitable stacking semiconductor layers functioning as a single LED (also referred to below as a light-emitting part or region), and may have, for example, a hetero-junction epitaxial layer structure. As shown in FIGS. 1 to 3, the LED epitaxial films 106 are arranged in a row at regular intervals. However, the LED epitaxial films 106 may not be arranged at regular intervals. Further, the arrangement of the LED epitaxial films 106 is not limited to a single row, but the LED epitaxial films 106 may be arranged as regularly shifted in a direction perpendicular to a direction of the arrangement of the LED epitaxial films 106. Furthermore, the number of the LED epitaxial films 106 is not limited to the illustrated value. The LED epitaxial films 106 can have a width much smaller than the width (typically, about 400 µm) of a substrate of the conventional LED print head having electrode pads.

The thickness of the LED epitaxial films 106 may be about 2 µm that is sufficient to secure stable characteristics (e.g., light-emitting characteristics or electrical characteristics) of the LED. The thickness of the LED epitaxial films 106 is much smaller than the thickness (typically, about 300 µm) of the conventional LED print head. As the thickness of the LED epitaxial films 106 is increased, a disconnection due to poor step coverage tends to occur in the thin-film wiring layer (e.g. the individual interconnecting layers 107) formed on the LED epitaxial film 106. In order to avoid occurrence of the disconnection, it is desirable that the LED epitaxial films 106 have a thickness of about 10 µm or less. In this connection, by taking measures, e.g., to planarize the stepped zone with use of insulating material such as polyimide, it is also possible to set the thickness of the LED epitaxial films 106 to exceed 10 µm.

The Si substrate 101 is a monolithic Si substrate, in which the integrated circuit 102 is formed. The integrated circuit 102 of the Si substrate 101 includes a plurality of driving-ICs for driving a plurality of LEDs. The plurality of driving-ICs and the plurality of LED epitaxial films 106 face to each other in a one-to-one correspondence, for example. Besides the driving circuits, the integrated circuit 102 includes a circuit commonly used for illumination control of the LEDs 105. The Si substrate 101 has a thickness of about 300 µm, for example. The other materials such as amorphous silicon, single crystal silicon, polysilicon, compound semiconductor, organic semiconductor, and insulating material (such as glass or sapphire) can be used as the substrate material.

The first interdielectric layer 103 can have a single-layer or multi-layer structure including, for example, at least one of a silicon oxide ($SiO_2$) film and a silicon nitride ($Si_3N_4$) film. For the purpose of causing the LED epitaxial films 106 to normally operate, the first interdielectric layer 103 has a function of electrically isolating the surface of the Si substrate 101 from the LED epitaxial films 106. The first interdielectric layer 103 is formed on the surface of the substrate 101 in a region adjacent to but not overlapping the part in which the integrated circuit 102 is formed.

The adhesion layer 104 is a semiconductor layer such as a polycrystalline silicon layer or an amorphous silicon layer. The adhesion layer 104 is formed, for example, by chemical vapor deposition (CVD). Since the adhesion layer 104 has a high affinity with the first interdielectric layer 103, a high bonding strength can be provided between the adhesion layer 104 and the first interdielectric layer 103. The bonding force between the adhesion layer 104 and the first interdielectric layer 103 probably results from intermolecular force between the layers and/or rearrangement of atoms between the layers.

The electrically conductive layer 105 are, for example, palladium or gold films, or films of metal material including palladium and/or gold, with a thickness of about one hundred nanometers (100 nm=0.1 µm). Since the adhesion layer 104 has a high affinity with the electrically conductive layer 105, a high bonding strength can be provided between the adhesion layer 104 and the electrically conductive layer 105. The bonding force between the adhesion layer 104 and the electrically conductive layer 105 probably results from intermolecular force between the layers and/or rearrangement of atoms between the layers.

The LED epitaxial films 106 are bonded to the surfaces of the electrically conductive layer 105. The functions of the electrically conductive layer 105 includes both fixing the LED epitaxial films 106 to the adhesion layer 104 and electrical connecting a common electrode layer of the bottom surface of the LED epitaxial films 106 to a common electrode area (ground potential, for example) on the Si substrate 101. It is desirable that an ohmic contact be created between the electrically conductive layer 105 and the common electrode area of the bottom surface of the LED epitaxial films 106. Electrical connection between the electrically conductive layer 105 and the common terminal area (e.g., ground potential) of the Si substrate 101 can be established by means of an interconnecting line (not shown in the figures) or through openings (not shown in the figures) made in the first interdielectric layer 103, for example. The common electrode areas of the LED epitaxial films 106 in this embodiment is an n-type GaAs layer 111 shown in FIG. 4 that occupies the entire bottom surface of the LED epitaxial film 106. Further, the common terminal area of the Si substrate 101 is the surface area of the Si substrate which is in contact with the electrically conductive layer 105, and in this embodiment, is a region of the Si substrate 101 on the common potential side (on the n-electrode side) for LED driving. The thickness of the electrically conductive layer 105 is, for example, about 100 nm (=0.1 μm).

As shown in FIG. 4, the LED epitaxial film 106 has a stacking layered structure of an n-type GaAs layer 111, an n-type $Al_xGa_{1-x}As$ layer 112 ($0 \leq x \leq 1$), a p-type $Al_yGa_{1-y}As$ layer 113 ($0 \leq y \leq 1$), a p-type $Al_zGa_{1-z}As$ layer 114 ($0 \leq z \leq 1$), and a p-type GaAs layer 115, which are grown in this order. The second interdielectric layer 109 is formed on the p-type GaAs layer 115. The individual interconnecting layer 107 is formed on the p-type GaAs layer 115 within an opening 109a of the second interdielectric layer 109. In this connection, the GaAs layer 111 and the $Al_xGa_{1-x}As$ layer 112 may be set to have a p-type and the $Al_yGa_{1-y}As$ layer 113, $Al_zGa_{1-z}As$ layer 114 and GaAs layer 115 may be set to have an n-type. The GaAs layer 111 has a thickness of about 10 nm (=0.01 μm), the $Al_xGa_{1-x}As$ layer 112 has a thickness of about 0.5 μm, the $Al_yGa_{1-y}As$ layer 113 has a thickness of about 1 μm, $Al_zGa_{1-z}As$ layer 114 has a thickness of about 0.5 μm, and the GaAs layer 115 has a thickness of about 10 nm (=0.01 μm). In this case, the thickness of the LED epitaxial films 106 is about 2.02 μm. However, the thicknesses of the respective layers are not limited to the aforementioned values. Further, the Al composition of each layer may be set to satisfy a relationship of x>y and z>y, where x=z=0.4 and y=0.1. As the material of the LED epitaxial films 106, $(Al_xGa_{1-x})_yIn_{1-y}P$ (satisfying a relationship of $0 \leq x \leq 1$ and $0 \leq y \leq 1$, in this case), GaN, AlGaN, InGaN or the like may be employed.

The individual interconnecting layers 107 electrically connect upper surfaces of the light-emitting regions of the LED epitaxial films 106 and the individual electrode areas 108 of the Si substrate 101 respectively. The individual interconnecting layer 107 may connect to the output terminal area on the Si substrate. The individual interconnecting layers 107 may be formed by patterning a thin electrically conductive film such as a metal film. Specific examples of suitable films of the individual interconnecting layers 107 include (1) a film containing gold (Au), e.g., a single-layer gold film, a multi-layer film with titanium, platinum, and gold layers (a Ti/Pt/Au film), a multi-layer film with gold and zinc layers (an Au/Zn film), or a multi-layer film with a gold layer and a gold-germanium-nickel layer (an AuGeNi/Au film); (2) a film containing palladium (Pd), e.g., a single-layer palladium film or a multi-layer film with palladium and gold layers (a Pd/Au film); (3) a film containing aluminum (Al), e.g., a single-layer aluminum film or a multi-layer film with aluminum and nickel layers (an Al/Ni film); (4) a polycrystalline silicon (polysilicon) film; (5) a thin, electrically conductive oxide film such as an indium tin oxide (ITO) film or a zinc oxide (ZnO) film.

In each of the individual interconnecting layers 107, the material of a part contacting the light-emitting region may be different from the material of the other part. In this case, the above metal material and electrically conductive oxide materials may be suitably combined and used. It is desirable that all the individual interconnecting layers 107 be formed simultaneously by photolithography. Since the individual interconnecting layers 107 are formed from a thin film, a significant voltage drop will occur if the individual interconnecting layers 107 are too long. When several milliamperes of driving current is supplied through an individual interconnecting layer 107 that is 5 μm wide and 0.5 μm thick, for example, length of the individual interconnecting layer is preferably less than about 200 μm.

A second interdielectric layer 109 (shown in FIG. 4) is provided in a region where electric short-circuiting should be avoided, for example, between the individual interconnecting layers 107 and top- and side-surface of the LED epitaxial films 106, between the individual interconnecting layers 107 and the electrically conductive layer 105, between the individual interconnecting layers 107 and the surface of the Si substrate 101, between the individual interconnecting layers 107 and the surface of the Si substrate 101 in the region where the integrated circuit 102 is formed, or the like, thereby securing normal operation. The second interdielectric layer 109 may have a single-layer or multi-layer structure including, for example, at least one of a silicon oxide ($SiO_2$) film and a silicon nitride ($Si_3N_4$) film. When forming the second interdielectric layer 109, an insulating film is first formed by CVD or the like on the entire surface of the Si substrate 101 including the LED epitaxial films 106, and then subjected to a photolithographic process to make through-holes on the LED epitaxial films 106 and the individual terminal areas 108 of the integrated circuit 102. Thereafter, when a metal layer is formed on the entire surface of the resultant structure and is patterned by the photolithographic process, a plurality of the individual interconnecting layers 107 for connecting between the plurality of LED epitaxial films 106 and the individual terminal areas 108 of the integrated circuit 102 can be formed simultaneously. Lift-off process may be applied to form the individual interconnecting layers.

Figure 5:
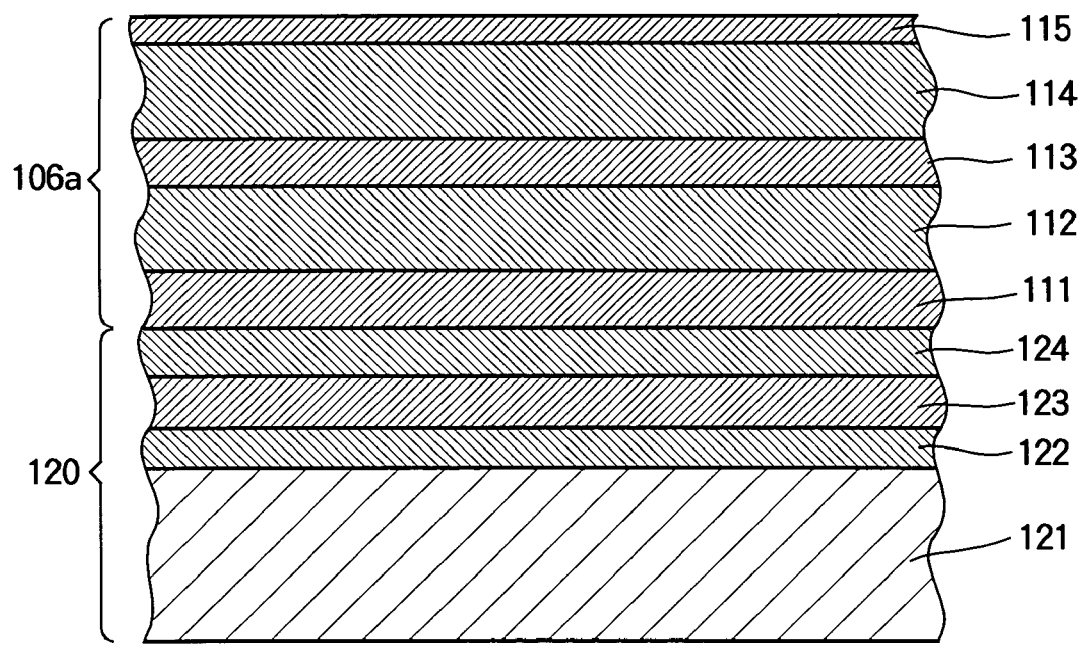
FIG. 5 is a schematic cross sectional view for explaining a first process of fabricating the integrated LED/driving-IC chip of the first embodiment.
Figure 6:
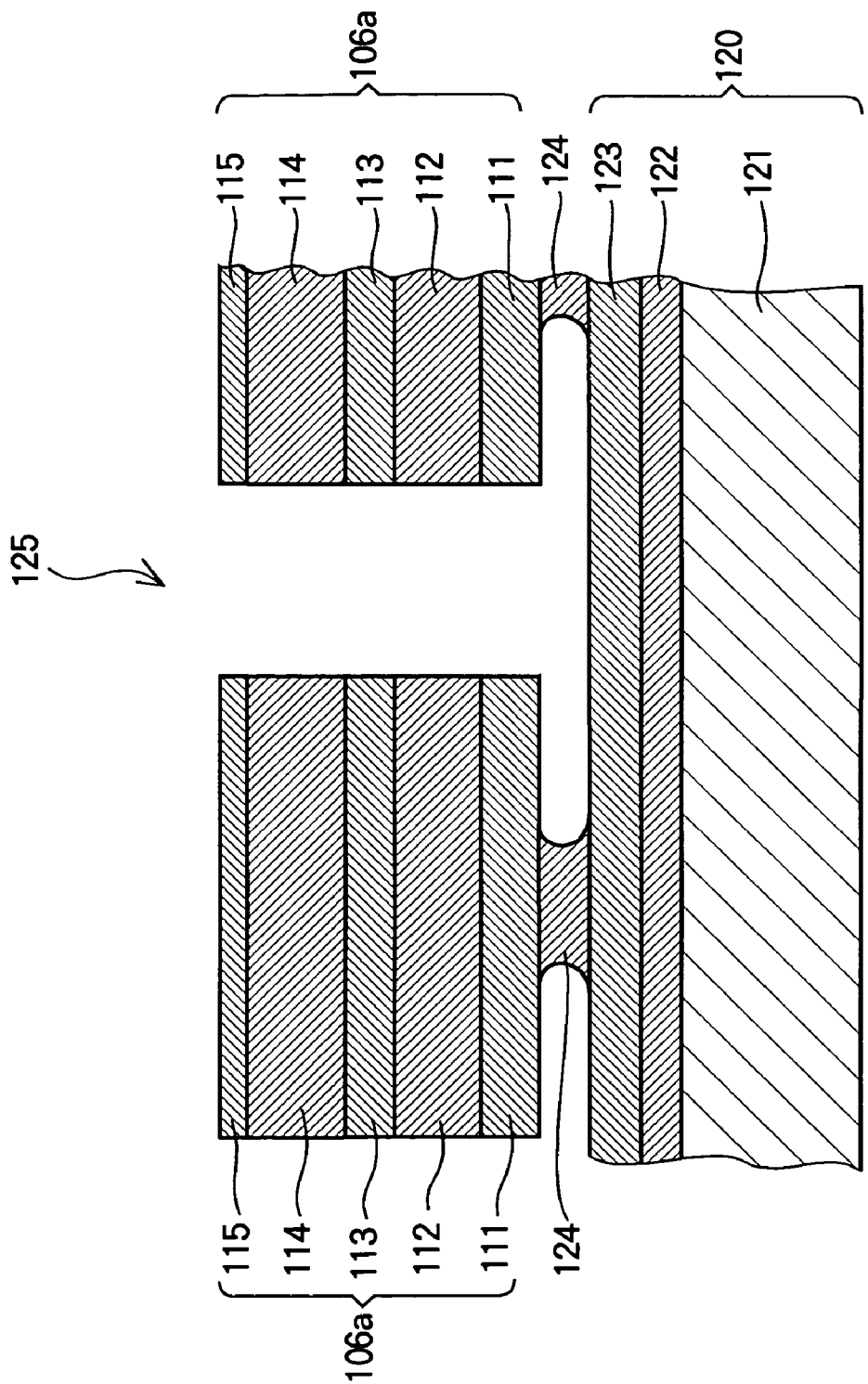
FIG. 6 is a schematic cross sectional view for explaining a second process of fabricating the integrated LED/driving-IC chip of the first embodiment.

Next, a process of fabricating the LED epitaxial films 106 will be described. FIGS. 5 and 6 are schematic cross sectional views for explaining a process of fabricating the LED epitaxial films 106.

An LED epitaxial layer 106a can be fabricated by the techniques such as metal organic chemical vapor deposition (MOCVD) or molecular beam epitaxy (MBE). After lifting off the LED epitaxial layer 106a, it becomes the LED epitaxial film 106. Before fabricating the LED epitaxial layer 106a, as shown in FIG. 5, the LED epitaxial film fabrication substrate 120 is formed. The fabrication substrate 120 in FIG. 5 includes a GaAs substrate 121, a GaAs buffer layer 122, an aluminum-gallium indium phosphide ((AlGa)InP) etching stop layer 123, and an aluminum arsenide (AlAs) sacrificial layer 124. The n-type GaAs contact layer 111, n-type $Al_xGa_{1-x}As$ lower cladding layer 112, n-type $Al_yGa_{1-y}As$ active layer 113, n-type $Al_zGa_{1-z}As$ upper cladding layer 114, and p-type GaAs contact layer 115 are formed in this order on the AlAs sacrificial layer 124, creating an LED epitaxial layer 106a. Lifting-off of the LED epitaxial layer 106a can be carried out by a chemical lift off method. In this case, the (AlGa)InP etching stop layer 123 may be omitted. Further, the structures of the semiconductor epitaxial layer 106a and the fabrication substrate 120 are not limited to those shown in FIG. 5, and various modifications of the LED epitaxial layer 106a and the fabrication substrate 120 can be made.

As shown in FIG. 6, the AlAs sacrificial layer 124 is selectively removed with use of a 10% HF (hydrogen fluoride) solution. Since an etching rate for the AlAs sacrificial layer 124 is much larger than an etching rate for the AlGaAs layers 112 to 114, GaAs layers 111, 115, 121, 122, and etching stop layer 123; the AlAs sacrificial layer 124 can be selectively etched. As a result, the LED epitaxial layer 106a (LED epitaxial film 106) can be lifted off from the LED epitaxial film fabrication substrate 120.

To this end, as shown in FIG. 6, the respective epitaxial layers 111 to 115 are previously etched so that trenches 125 are made therein. The formation of the trenches 125 are carried out by photolithography for masking the epitaxial layers with use of resist for the trench formation and etching the epitaxial layers using a phosphate peroxide etchant (i.e., a solution of phosphoric acid and hydrogen peroxide). The phosphate peroxide etchant etches the AlGaAs layers 112 to 114 and GaAs layers 111, 115, 121, 122. However, since the etching rate of the etchant for the etching stop layer 123 is low, the trench 125 formed from the upper surface can be prevented from arriving at the GaAs substrate 121 during the etching. After the trench 125 is formed, the AlAs sacrificial layer 124 is etched using the HF solution and then the LED epitaxial film 106 is lifted off. Although the AlAs sacrificial layer 124 is illustrated as still remain (as etched halfway) in FIG. 6, the AlAs sacrificial layer 124 is completely removed in such a condition as to carry the LED epitaxial film 106. After the AlAs sacrificial layer 124 has been completely removed by etching, the LED epitaxial film 106 is immersed in deionized water so that no etching solution residue remains. When lifting off the LED epitaxial film 106, a supporting material for carrying and protecting the LED epitaxial film can be provided on the LED epitaxial film 106. For example, when the supporting material is provided on the LED epitaxial film 106, the supporting material can be transferred to a predetermined position by sucking the surface of the supporting material by vacuum suction or bonding the surface of the supporting material by a photohardening adhesive sheet, which hardens and loses its adhesive property when subjected to light irradiation.

Figure 7:
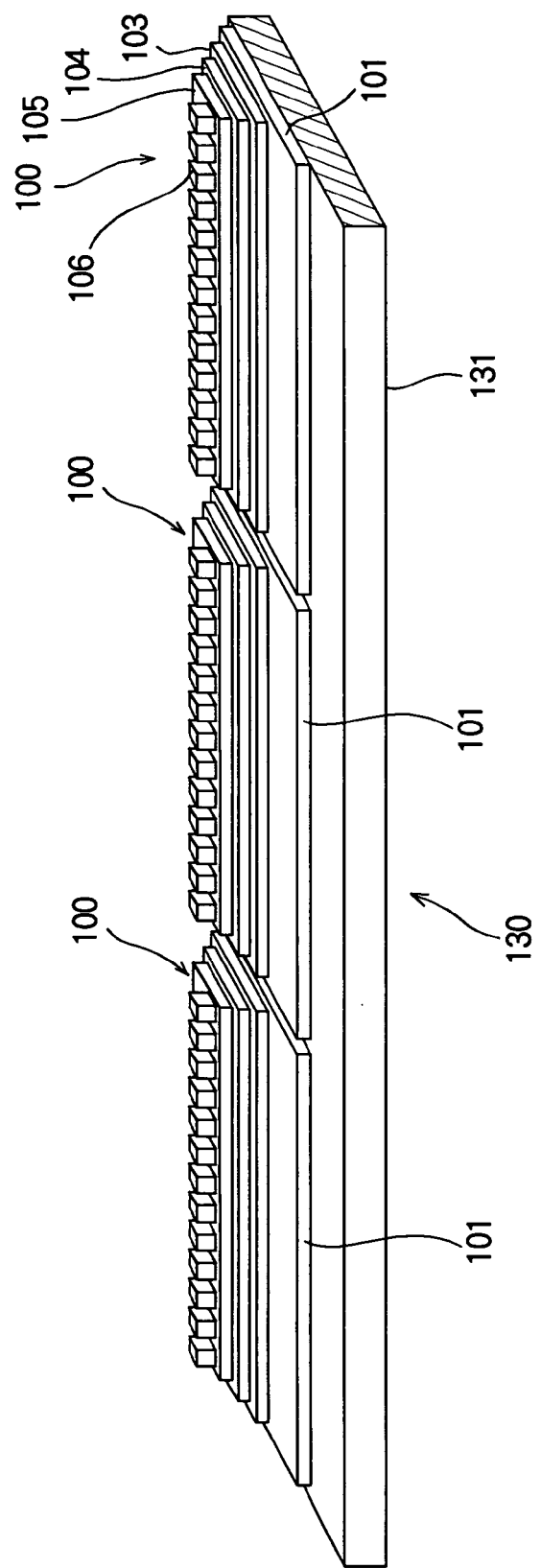
FIG. 7 is a perspective view schematically showing an LED unit having the integrated LED/driving-IC chip of the first embodiment mounted on a mounting board.

FIG. 7 is a perspective view schematically showing an LED unit 130 in which the integrated LED/driving-IC chip 100 of the first embodiment is mounted on a mounting board.

As shown in FIG. 7, the LED unit 130 includes a COB (chip on board) mounting board 131 and a plurality of integrated LED/driving-IC chips 100 provided on the mounting board 131. The plurality of integrated LED/driving-IC chips 100 are mounted on the mounting board 131 as spaced by an equal distance with use of such an adhesive as insulating paste or electrically conductive paste. The plurality of integrated LED/driving-IC chips 100 are located on the mounting board 131 so that, for example, the LED epitaxial films (which are LEDs in this embodiment) 106 are arranged in a row at regular intervals along a full length of the longitudinal direction of the LED unit 130.

A wiring pattern (not shown) and electrode pads are provided to the mounting board 131 for supplying power and a control signal (turn-on data) necessary for controlling illumination of the LEDs of the integrated LED/driving-IC chips 100 to the integrated circuit 102 (a group of driving-ICs) of the integrated LED/driving-IC chips 100. The Si substrate 101 of the integrated LED/driving-IC chip 100 is provided with electrode pads (not shown) which receive the power or control signal from the mounting board 131. The LED unit 130 may have bonding wires which electrically connecting the electrode pads of the mounting board 131 and the electrode pads on the Si substrate 101 of the integrated LED/driving-IC chip 100.

As has been described above, in the integrated LED/driving-IC chip 100 of the first embodiment, since it is not necessary to provide electrode pads for wire bonding on the LED epitaxial film 106, space can be saved and the area occupied by the LED epitaxial films 106 can be much smaller than the area occupied by a conventional LED array chip. Furthermore, since the LED epitaxial films 106 are supported by the Si substrate 101 and need not be thickened to provide strength for wire bonding, it can be much thinner than a conventional LED array chip. These effects lead to a substantial reduction in material costs. Furthermore, in the integrated LED/driving-IC chip 100 of the first embodiment, since the need for providing the electrode pads on the LED epitaxial films 106 is eliminated, the integrated LED/driving-IC chip 100 can be made small in size.

In the integrated LED/driving-IC chip 100 of the first embodiment, further, the LED epitaxial films 106 bonded on the Si substrate 101 and the integrated circuit 102 formed in the Si substrate 101 are electrically connected to each other by means of the thin individual interconnecting layers 107 formed by photolithography. Since the LED epitaxial films 106 are supported by the Si substrate 101 and need not be thickened to provide strength for wire bonding, it can be much thinner than a conventional LED array chip. These effects lead to a substantial reduction in material costs.

In the integrated LED/driving-IC chip 100 of the first embodiment, furthermore, the adhesion layer 104 made of polycrystalline silicon or the like having a high affinity with both of the insulating material of the first interdielectric layer 103 and the material (such as metal material) of the LED epitaxial films 106 is disposed between the first interdielectric layer 103 and the electrically conductive layer 105. As a result, a high bonding strength can be established between the first interdielectric layer 103 and the electrically conductive layer 105 and thus between the first interdielectric layer 103 and the LED epitaxial films 106, resulting in that the reliability of the chip can be secured.

Second Embodiment

Figure 8:
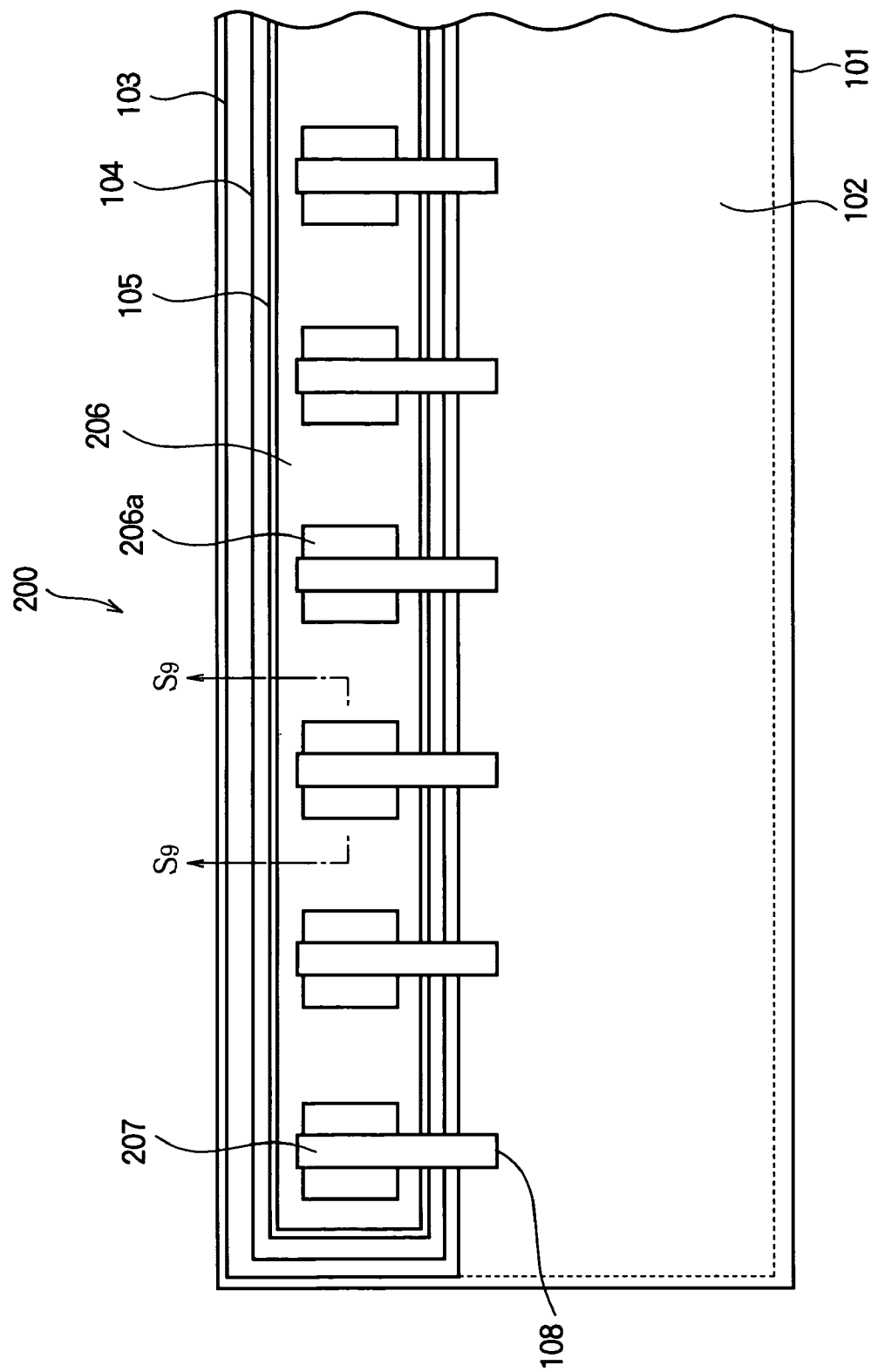
FIG. 8 is a plan view schematically showing a part of an integrated LED/driving-IC chip in accordance with a second embodiment of the present invention.
Figure 9:
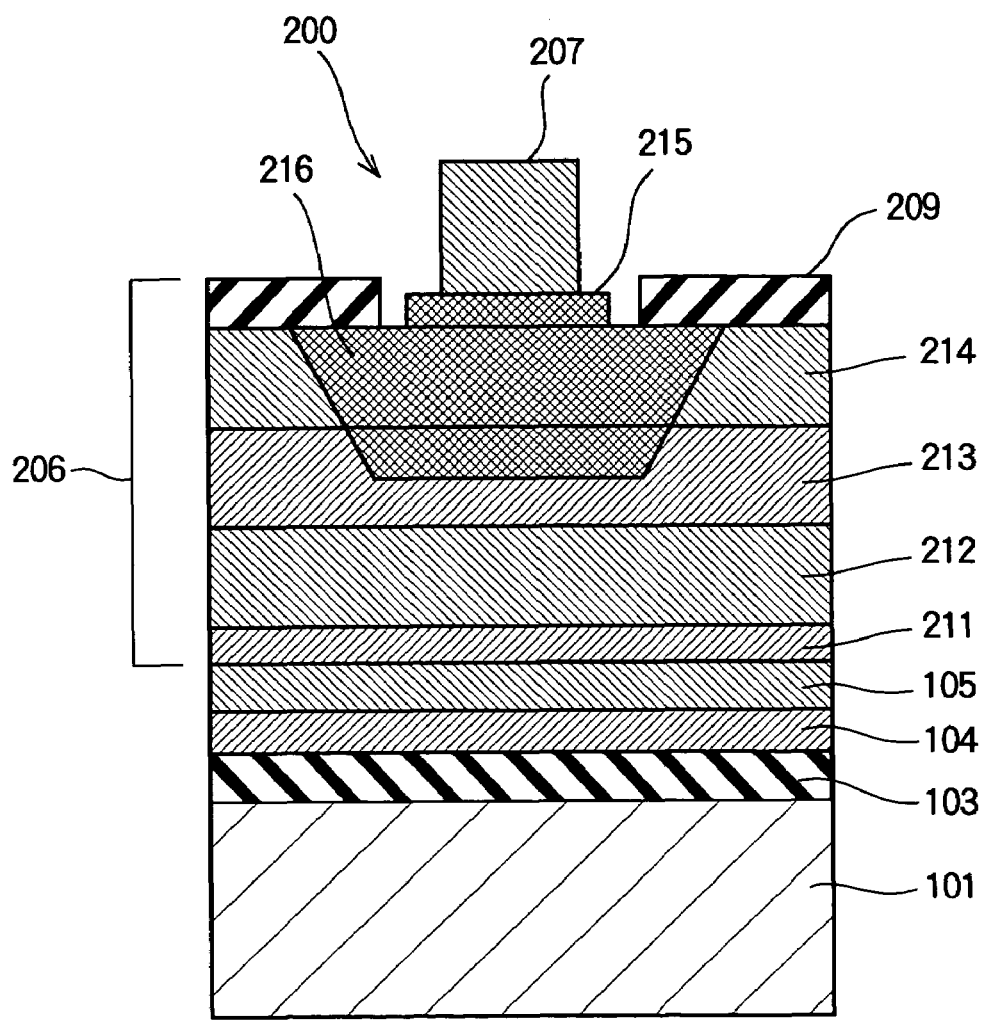
FIG. 9 is a schematic cross sectional view showing a cross section through line $S_9$—$S_9$ in FIG. 8.

FIG. 8 is a plan view schematically showing a part of an integrated LED/driving-IC chip 200 as a semiconductor apparatus in accordance with a second embodiment of the present invention, and FIG. 9 is a schematic cross sectional view showing a cross section through line $S_9$—$S_9$ in FIG. 8.

In FIG. 8, parts that are the same as or correspond to those in FIG. 2 (first embodiment) are denoted by the same reference numerals. The integrated LED/driving-IC chip 200 shown in FIG. 8 is different from the integrated LED/driving-IC chip 100 of the first embodiment including the plurality of LED epitaxial films 106 having a single LED, in a point that an elongated LED epitaxial film 206 having a plurality of LEDs (also referred to as light-emitting parts or regions) 206a is bonded on the electrically conductive layer 105.

The cross sectional structure of the integrated LED/driving-IC chip 200 of the second embodiment will next be described. As shown in FIG. 9, the integrated LED/driving-IC chip 200 has a structure of an Si substrate 101, a first interdielectric layer 103, an adhesion layer 104 made of material such as polycrystalline silicon or amorphous silicon, an electrically conductive layer 105, an LED epitaxial film 206, a second interdielectric layer 209 and an individual interconnecting layer 207, which are formed in this order. As shown in FIG. 9, the LED epitaxial film 206 has a structure of an n-type GaAs layer 211, an n-type $Al_xGa_{1-x}As$ layer 212 ($0 \leq x \leq 1$), an n-type $Al_yGa_{1-y}As$ layer 213 ($0 \leq y \leq 1$), an n-type $Al_zGa_{1-z}As$ layer 214 ($0 \leq z \leq 1$), and a GaAs layer 215, which are grown in this order. A Zn diffusion region 216 is formed in the n-type $Al_yGa_{1-y}As$ layer 213 and n-type $Al_zGa_{1-z}As$ layer 214 under the GaAs layer 215. The GaAs layer 215 and Zn diffusion region 216 are of the p-type.

The n-type GaAs layer 211 has a thickness of about 10 nm (=0.01 μm), the n-type $Al_xGa_{1-x}As$ layer 212 has a thickness of about 0.5 μm, the n-type $Al_yGa_{1-y}As$ layer 213 has a thickness of about 1 μm, the n-type $Al_zGa_{1-z}As$ layer 214 has a thickness of about 0.5 μm, and the n-type GaAs layer 215 has a thickness of about 10 nm (=0.01 μm). In this case, the thickness of the LED epitaxial film 206 becomes about 2.02 μm. However, the thicknesses of the layers are not restricted to the above values. In addition, other material such as $(Al_xGa_{1-x})_yIn_{1-y}P$ (satisfying a relationship of $0 \leq x \leq 1$ and $0 \leq y \leq 1$, in this case), GaN, AlGaN, or InGaN may be employed as the material of the adhesion layer 104.

The Al compositions of the above layers may set to satisfy a relationship of x>y and z>y (e.g., x=z=0.4 and y=0.1). The diffusion front of the Zn diffusion region 216 is designed to be positioned in the interior of the n-type $Al_yGa_{1-y}As$ layer 213. In this structure, minority carriers injected through the pn junction are confined within the n-type $Al_yGa_{1-y}As$ active layer 213 and the p-type $Al_yGa_{1-y}As$ region created therein by zinc diffusion, so that high luminous efficiency is obtained. The structure shown in FIG. 9 enables high luminous efficiency to be obtained with an LED epitaxial film 104 as thin as about 2 μm. The above explanation has been made in connection with the LED fabricating method wherein the plurality of epitaxial layers have been grown to form a double hetero-junction structure and then the opposite conductive-type impurity diffusion region as Zn diffusion region is formed therein to create a homo-junction type LED. However, it is also possible to create another type of homo-junction type LED by forming the diffusion region in the single hetero-junction structure or the single-layer epitaxial layer.

Figure 10:
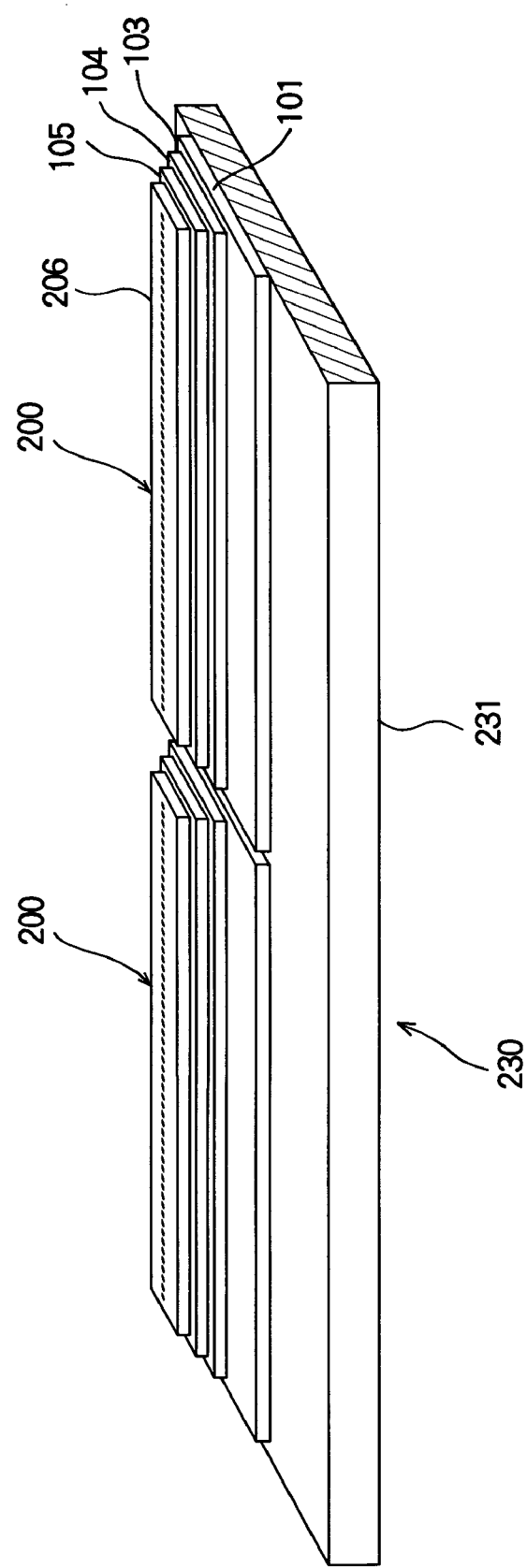
FIG. 10 is a perspective view schematically showing an LED unit having the integrated LED/driving-IC chip of the second embodiment mounted on a mounting board.

FIG. 10 is a perspective view schematically showing an LED unit 230 wherein the integrated LED/driving-IC chip 200 of the second embodiment is mounted on a mounting board.

As shown in FIG. 10, the LED unit 230 includes a mounting board 231 and a plurality of integrated LED/driving-IC chips 200 provided on the mounting board 231. The plurality of integrated LED/driving-IC chips 200 are mounted on the mounting board 231 with use of an adhesive such as insulating paste or electrically conductive past as spaced by an equal distance. The plurality of integrated LED/driving-IC chips 200 are disposed on the mounting board 231 so that, for example, the LEDs of the LED epitaxial films 206 are arranged in a row at regular intervals along a full length of the longitudinal direction of the LED unit 230.

As has been described above, in the integrated LED/driving-IC chip 200 of the second embodiment, the integrated LED/driving-IC chip 200 as the semiconductor apparatus can reduce its size and material cost, similarly to the first embodiment. Further, a high bonding strength can be established between the first interdielectric layer 103 and the LED epitaxial film 206, and thus the reliability of the apparatus can be secured.

The second embodiment is substantially the same as the first embodiment, except for the above-described respects.

Third Embodiment

Figure 11:
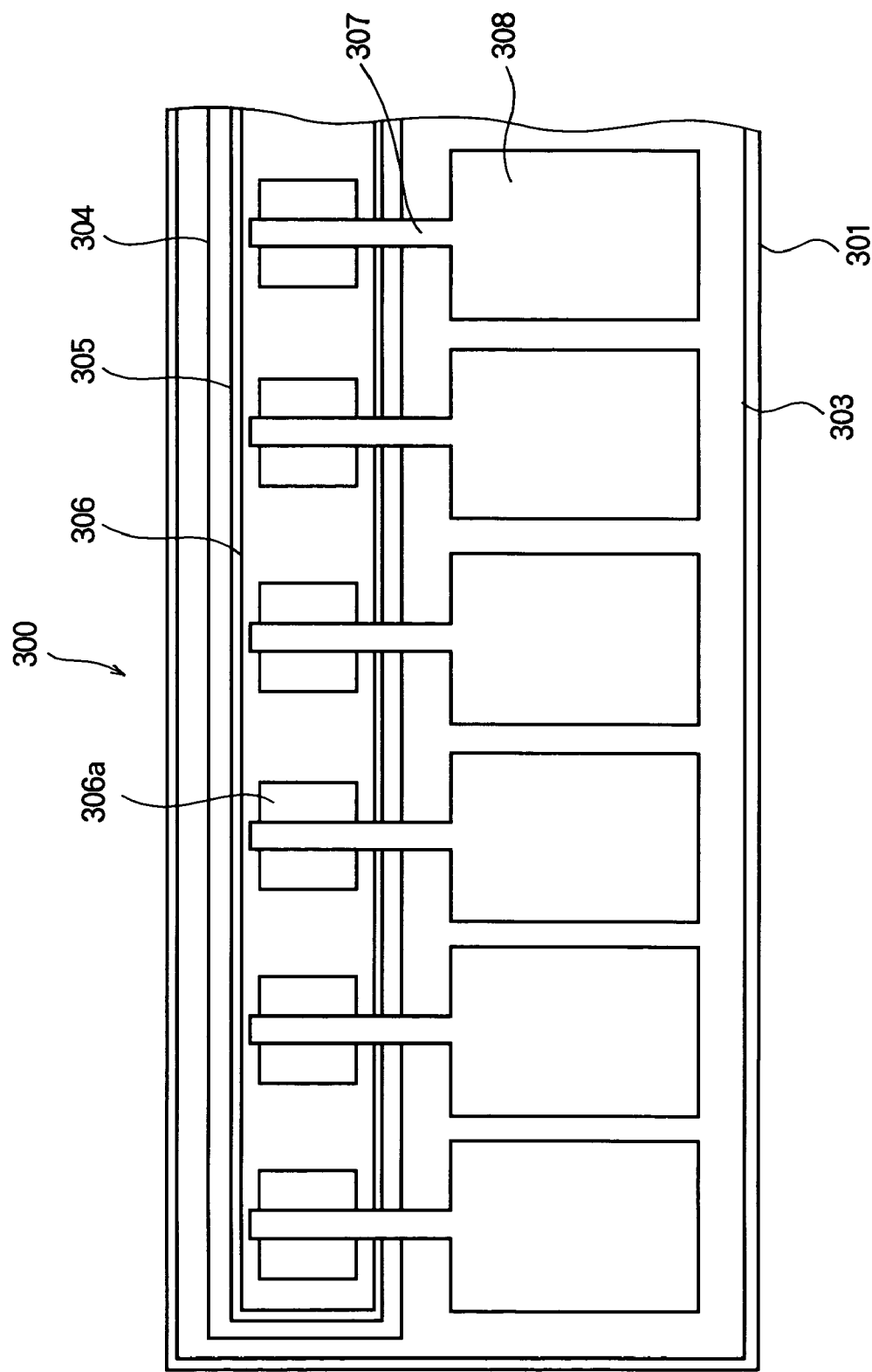
FIG. 11 is a plan view schematically showing a part of an integrated LED/driving-IC chip in accordance with a third embodiment of the present invention.

FIG. 11 is a plan view schematically showing a part of the integrated LED/driving-IC chip 300 as a semiconductor apparatus in accordance with a third embodiment of the present invention.

The integrated LED/driving-IC chip 300 of the third embodiment is different from the integrated LED/driving-IC chip of the above first or second embodiment, in a point that an interdielectric layer 303 is provided on the nearly entire surface of the substrate 301, electrode pads 308 corresponding to the respective LEDs are provided on the interdielectric layer 303, and individual interconnecting layers 307 are provided for electrically connecting the LEDs 306a and the electrode pads 308. As shown in FIG. 11, the integrated LED/driving-IC chip 300 of the third embodiment includes an adhesion layer 304 formed on an interdielectric layer 303, an electrically conductive layer 305 formed on the adhesion layer 304, and a plurality of LED epitaxial films 306 as sheet-like semiconductor thin films having the plurality of LEDs 306a and bonded on the electrically conductive layer 305. The electrode pads 308 are electrically connected to driving-ICs, for example, by flip chip bonding or wire bonding. Further, another interdielectric layer (not shown in the figures) is provided in such a region required to provide isolation as between the individual interconnecting layers 307 and the electrically conductive layer 305 and between the individual interconnecting layers 307 and the adhesion layer 304.

The third embodiment is substantially the same as the first or second embodiment, except for the above-described respects.

Fourth Embodiment

Figure 12:
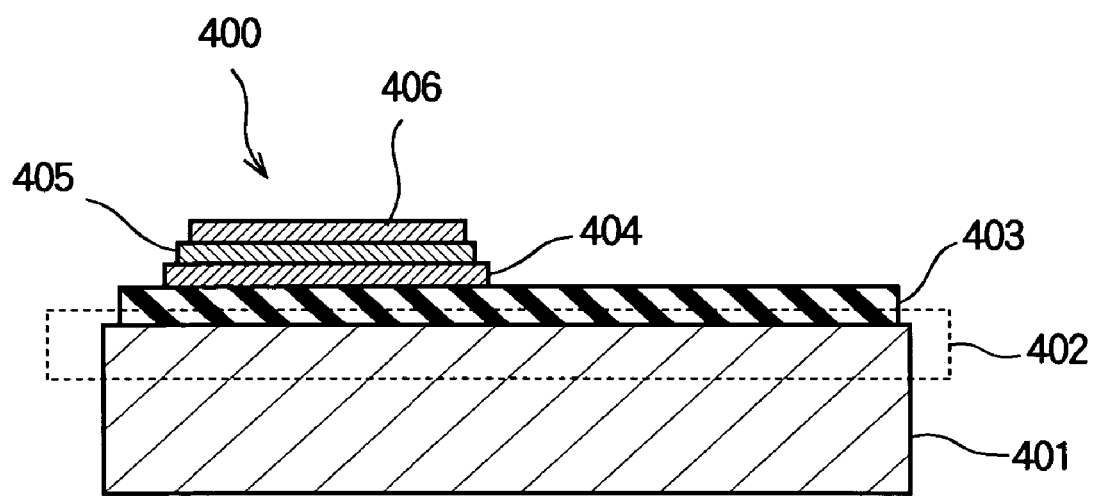
FIG. 12 is a schematic cross sectional view showing an integrated LED/driving-IC chip in accordance with a fourth embodiment.

FIG. 12 is a cross sectional view schematically showing a part of an integrated LED/driving-IC chip 400 as a semiconductor apparatus in accordance with a fourth embodiment of the present invention.

The integrated LED/driving-IC chip 400 of the fourth embodiment is different from that of the first embodiment wherein the LED epitaxial films 106 are provided on a region of the Si substrate 101 adjacent to a region in which the integrated circuit 102 is formed, in a point that LED epitaxial films 406 are disposed on an integrated circuit 402 of an Si substrate 401. As shown in FIG. 12, the integrated LED/driving-IC chip 400 of the fourth embodiment includes the Si substrate 401 having the integrated circuit 402 and a first interdielectric layer 403 formed on the integrated circuit 402. In this case, the upper surface of the first interdielectric layer 403 is subjected to a planarizing process such as CMP. The integrated LED/driving-IC chip 400 also includes an adhesion layer 404 formed on the first interdielectric layer 403, an electrically conductive layer 405 formed on the adhesion layer 404, and the LED epitaxial film 406 as a sheet-like semiconductor thin film bonded on the electrically conductive layer 405. The LED epitaxial film 406 may be an elongated sheet-like film having a plurality of LEDs (similar to that of the second embodiment) or may be a film having a single LED (similar to that of the first embodiment). The adhesion layer 404 and the metal layer 405 may be made in a similar manner to those of the first embodiment. Further, the integrated LED/driving-IC chip 400, as in the above first or second embodiment, has a second interdielectric layer (not shown in the figures) and individual interconnecting layers (not shown in the figures).

The fourth embodiment is substantially the same as the first-to-third embodiments, except for the above-described respects.

Fifth Embodiment

Figure 13:
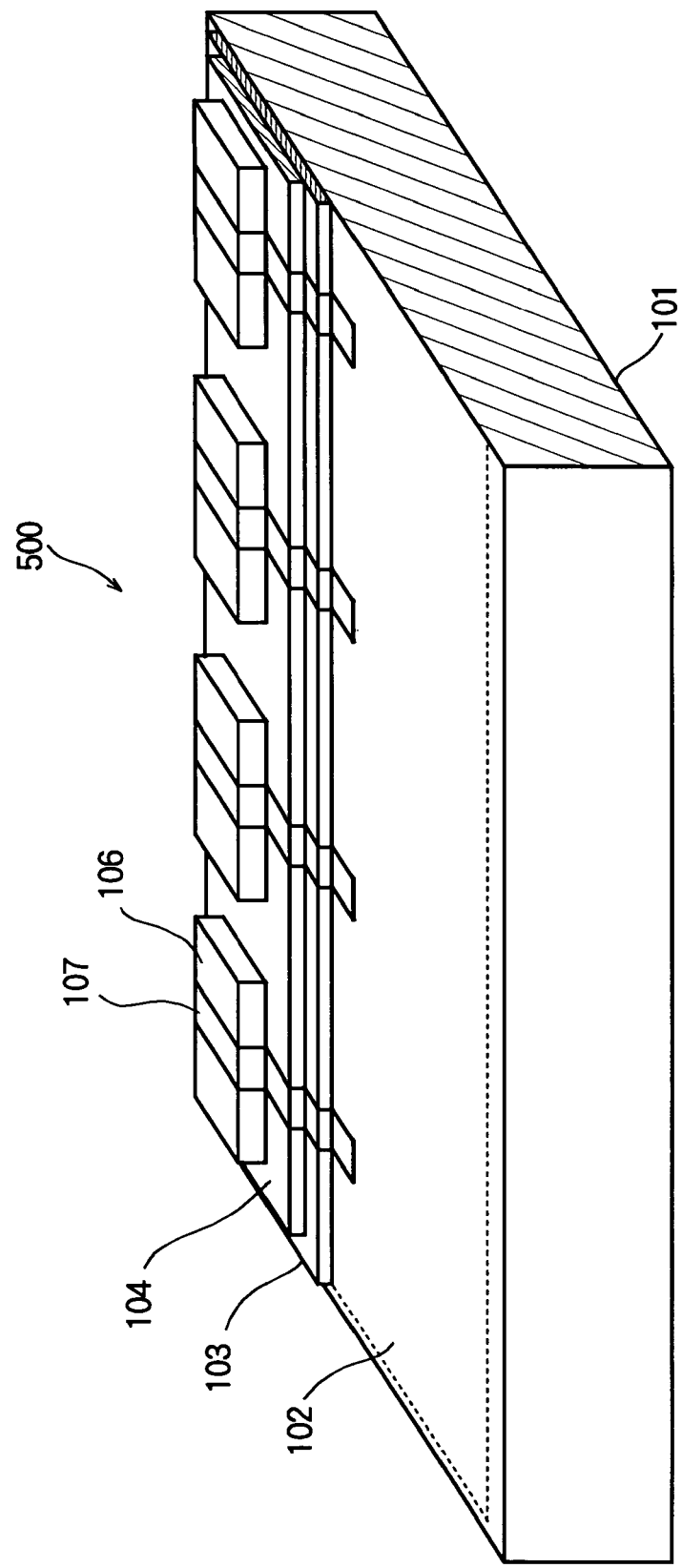
FIG. 13 is a perspective view schematically showing a part of an integrated LED/driving-IC chip in accordance with a fifth embodiment of the present invention.

FIG. 13 is a perspective view schematically showing a part of an integrated LED/driving-IC chip 500 as a semiconductor apparatus in accordance with a fifth embodiment of the present invention. In FIG. 13, parts that are the same as or correspond to those in FIG. 3 are denoted by the same reference numerals.

The integrated LED/driving-IC chip 500 of the fifth embodiment is different from the integrated LED/driving-IC chip 100 having the electrically conductive layer 105, in a point that the electrically conductive layer 105 (shown in FIG. 3) is not provided between the adhesion layer 104 and LED epitaxial films 106. In the integrated LED/driving-IC chip 500 of the fifth embodiment, the adhesion layer 104 having a high affinity with both the insulating material of the first interdielectric layer 103 and the material (such as compound semiconductor) of the LED epitaxial films 106 is disposed between the first interdielectric layer 103 and the LED epitaxial films 106. Thus, a high bonding strength can be established between the first interdielectric layer 103 and the LED epitaxial films 106, and the reliability of the device can be secured.

The fifth embodiment is substantially the same as the first to fourth embodiments, except for the above-described respects.

Sixth Embodiment

Figure 14:
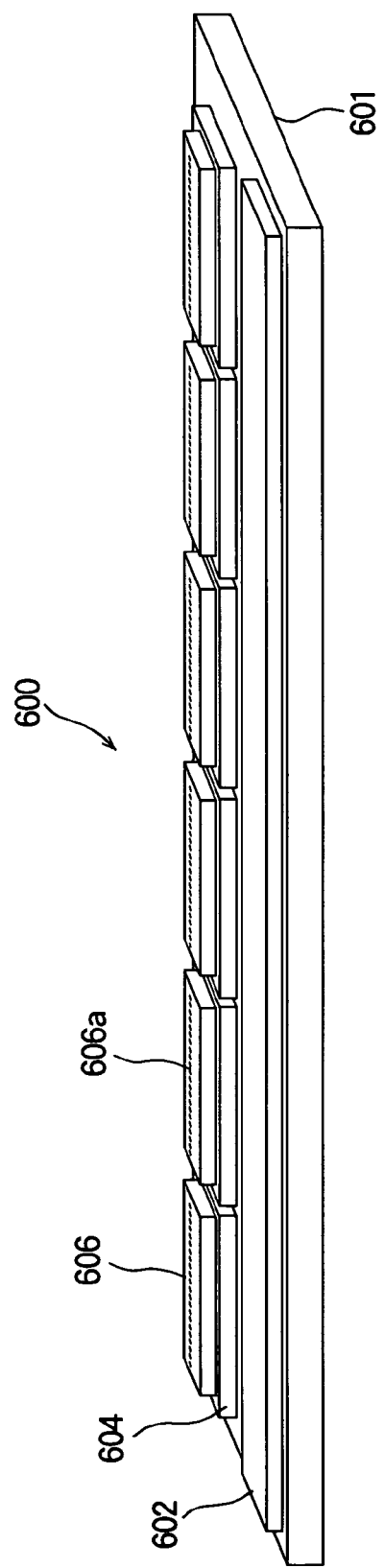
FIG. 14 is a perspective view schematically showing an integrated LED/driving-IC chip in accordance with a sixth embodiment of the present invention.
Figure 15:
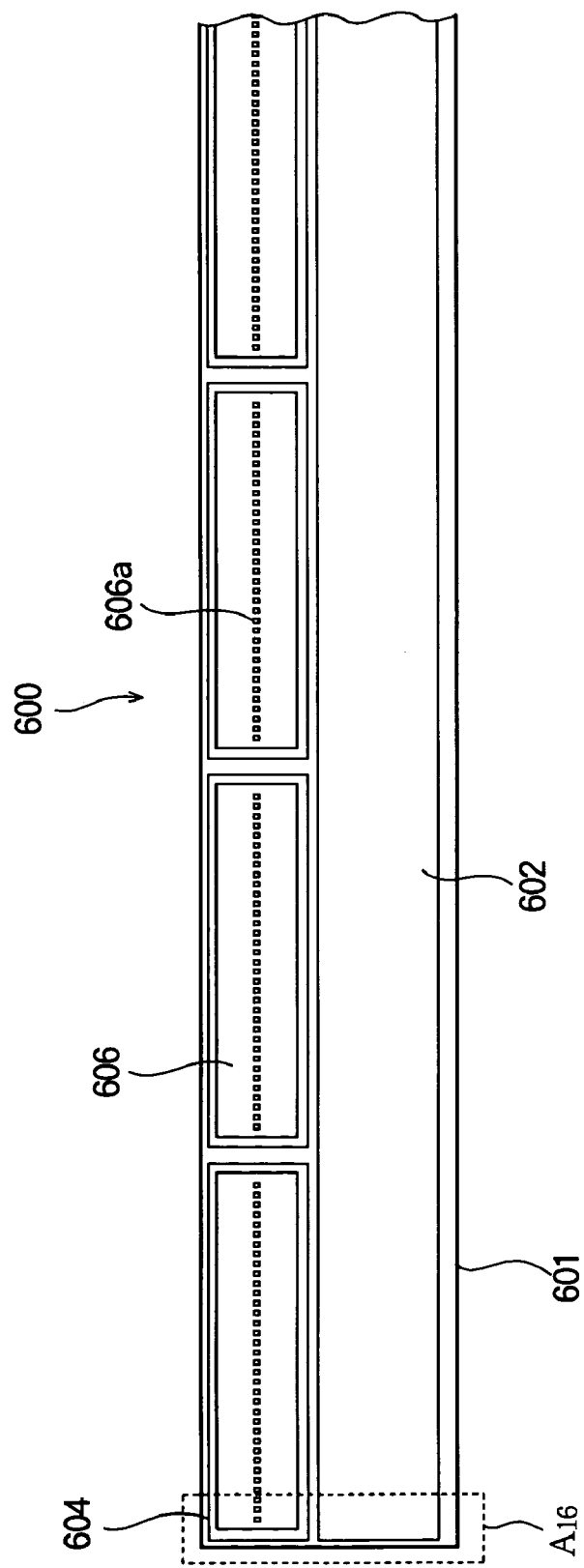
FIG. 15 is a perspective view schematically showing a part of the integrated LED/driving-IC chip of the sixth embodiment.

FIG. 14 is a perspective view schematically showing a part of an integrated LED/driving-IC chip 600 as a semiconductor apparatus in accordance with a sixth embodiment of the present invention. FIG. 15 is a plan view schematically showing a part of the integrated LED/driving-IC chip 600 of the sixth embodiment, and FIG. 16 is an enlarged perspective view of a part $A_{16}$ in FIG. 15.

Figure 16:
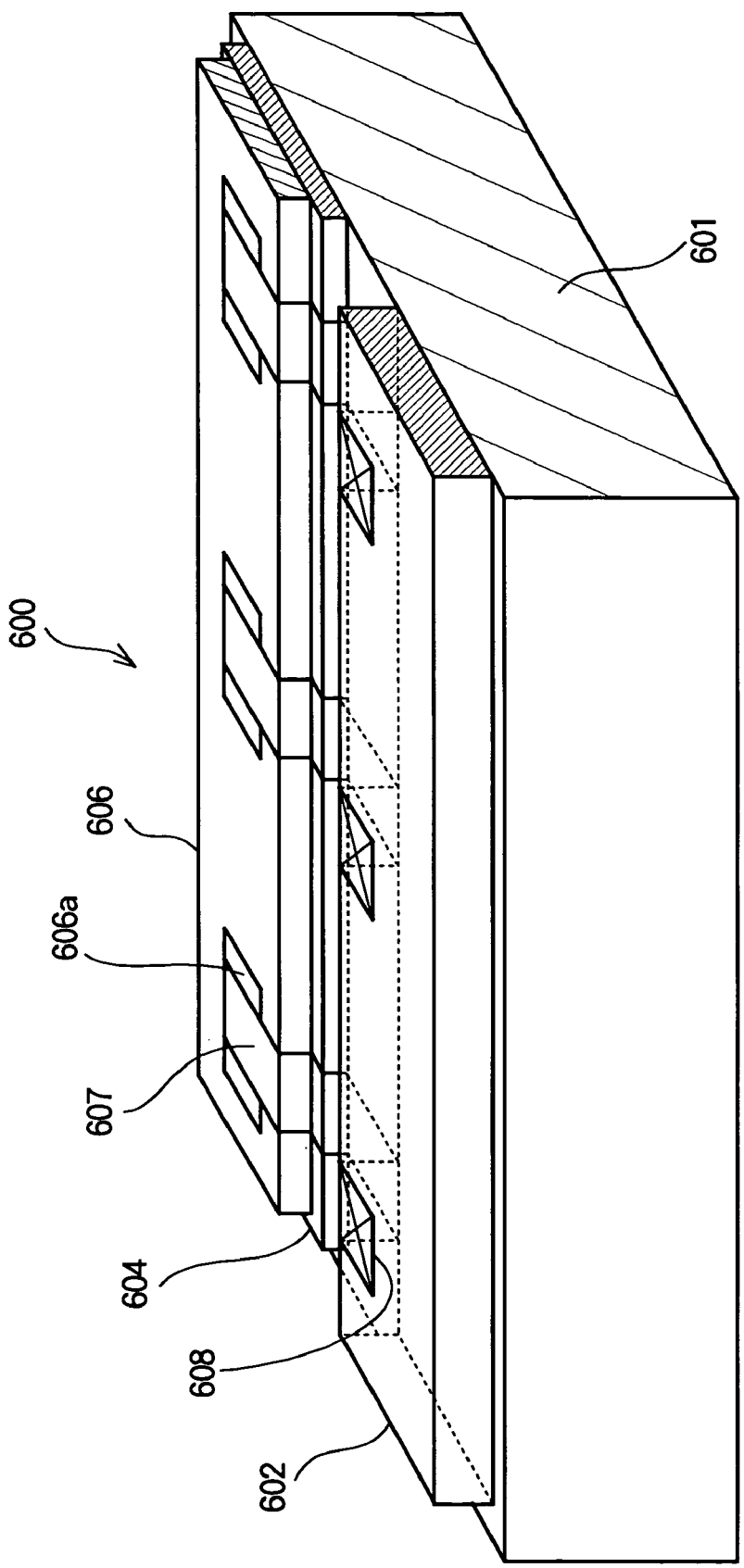
FIG. 16 is a perspective view schematically showing a part of the integrated LED/driving-IC chip of the sixth embodiment.

As shown in FIGS. 14 to 16, the integrated LED/driving-IC chip 600 of the sixth embodiment includes an insulating substrate 601, a plurality of adhesion layers 604 formed on the insulating substrate 601 and made of semiconductor material as its main material, and LED epitaxial films 606 as sheet-like semiconductor thin films having a plurality of LEDs 606a and bonded on the adhesion layers 604. The integrated LED/driving-IC chip 600 also includes a sheet-like driver integrated circuit device 602 formed on the insulating substrate 601, and individual interconnecting layers 607 (shown in FIG. 16) as thin films extending from the upper surfaces of the LEDs 606a via the upper surface of the insulating substrate 601 to the upper surfaces of individual terminal areas 608 on the integrated circuit device 602 having a group of driving-ICs. A second interdielectric layer (not shown in the figures) is provided under the individual interconnecting layers 607 as necessary.

The insulating substrate 601 is made of, e.g., a glass substrate. However, another insulating material such as resin or ceramic may be used as the material of the insulating substrate 601. The adhesion layer 604 has the same structure as the adhesion layer 104 in the first embodiment. The LED epitaxial films 606 each have a structure similar to the LED epitaxial film explained in the second embodiment. Similarly to the case explained in the first embodiment, each of the LED epitaxial films 606 may have a single LED. The material of the individual interconnecting layers 607 and how to form the layer are the same as those explained in the first embodiment.

Figure 17:
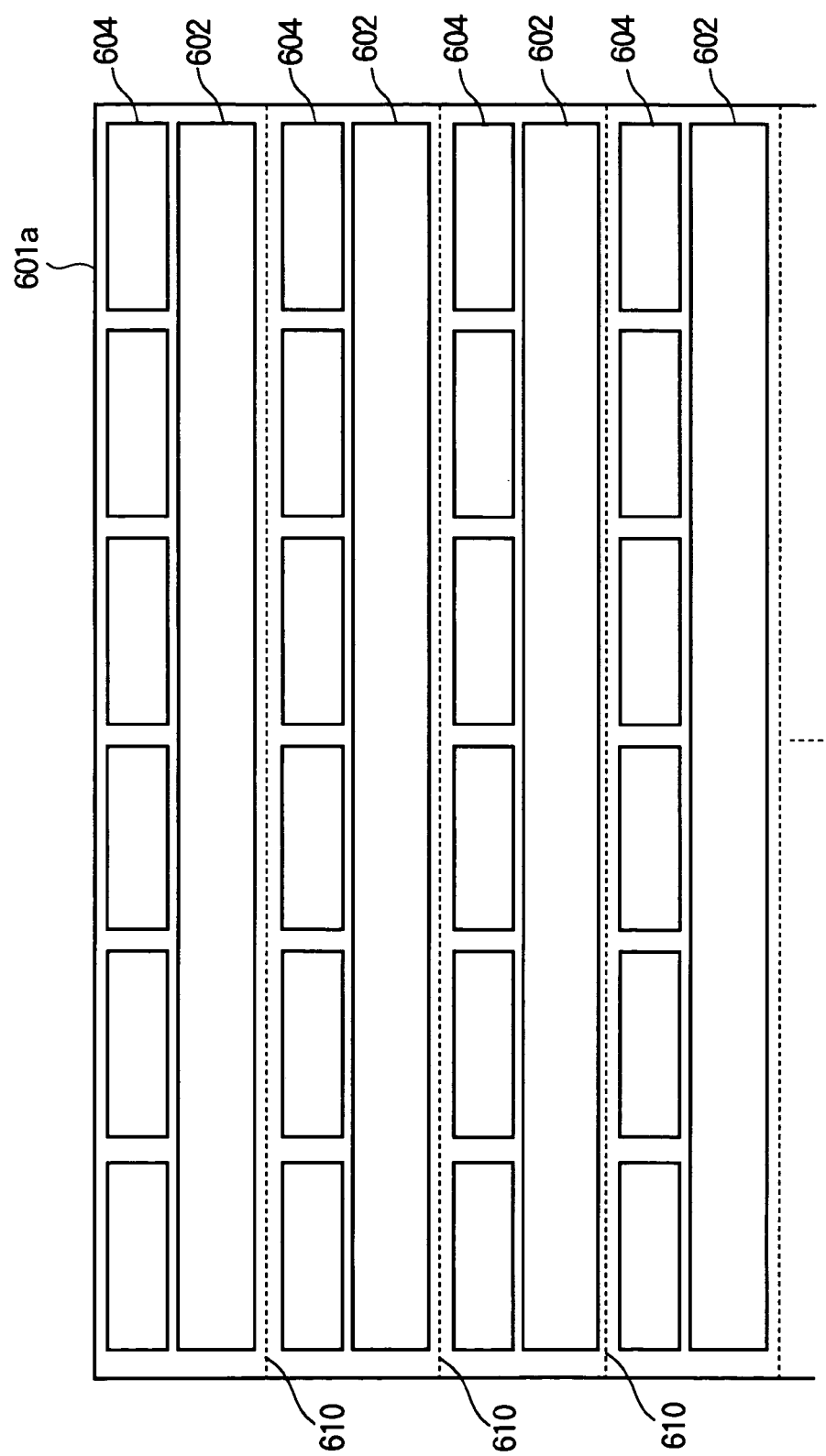
FIG. 17 is a schematic plan view for explaining a process of fabricating the integrated LED/driving-IC chip of the sixth embodiment.

FIG. 17 is a plan view for explaining a process of fabricating the integrated LED/driving-IC chip 600 of the sixth embodiment. As shown in FIG. 17, when fabricating the integrated LED/driving-IC chip 600, polycrystalline silicon layers as the adhesion layers 604 and polycrystalline silicon layers as the integrated circuit device 602 may be selectively formed on the glass substrate 601a before divided. When forming the polycrystalline silicon layers, for example, an $SiO_2$ layer having a thickness of several hundreds nanometers (nm) is formed by photolithography or the like in a predetermined region on the glass substrate 601a and then subjected to a CVD process or the like under a relatively low heating temperature to create a silicon thin film of an amorphous state. Next, the amorphous silicon is recrystallized to create a polycrystalline silicon layer by irradiating an excimer pulse laser or the like on the silicon thin film. When forming the integrated circuit device 602 or a polysilicon TFT driver circuit device using a thin-film transistor made of polycrystalline silicon as its main material, an integrated circuit pattern having a circuit element such as a transistor is formed on the polycrystalline silicon layer. Next, LED epitaxial films are bonded on the divided adhesion layers 604, the second interdielectric layer is formed, individual interconnecting layers are formed, and so on. Thereafter, the glass substrate 601a is cut along scheduled division lines 610 into divided insulating substrates 601. Before LED epitaxial film bonding on the substrate, the glass substrate 601a may be cut into smaller substrate regions having a plurality of the integrated LED/driving-IC chip regions. Other modifications in fabrication process will be possible.

As has been described above, in the integrated LED/driving-IC chip 600 of the sixth embodiment, since the adhesion layers 604 and the integrated circuit devices 602 can be fabricated in a common process, a positional relationship between the adhesion layers 604 and the integrated circuit device 602 can be made accurate.

Further, since the adhesion layers 604 and the integrated circuit 602 are formed on the glass substrate 601a in a common process, the device can be reduced in manufacturing cost to a large extent.

The sixth embodiment is substantially the same as the above first to fifth embodiments, except for the above-described respects.

Seventh Embodiment

Figure 18:
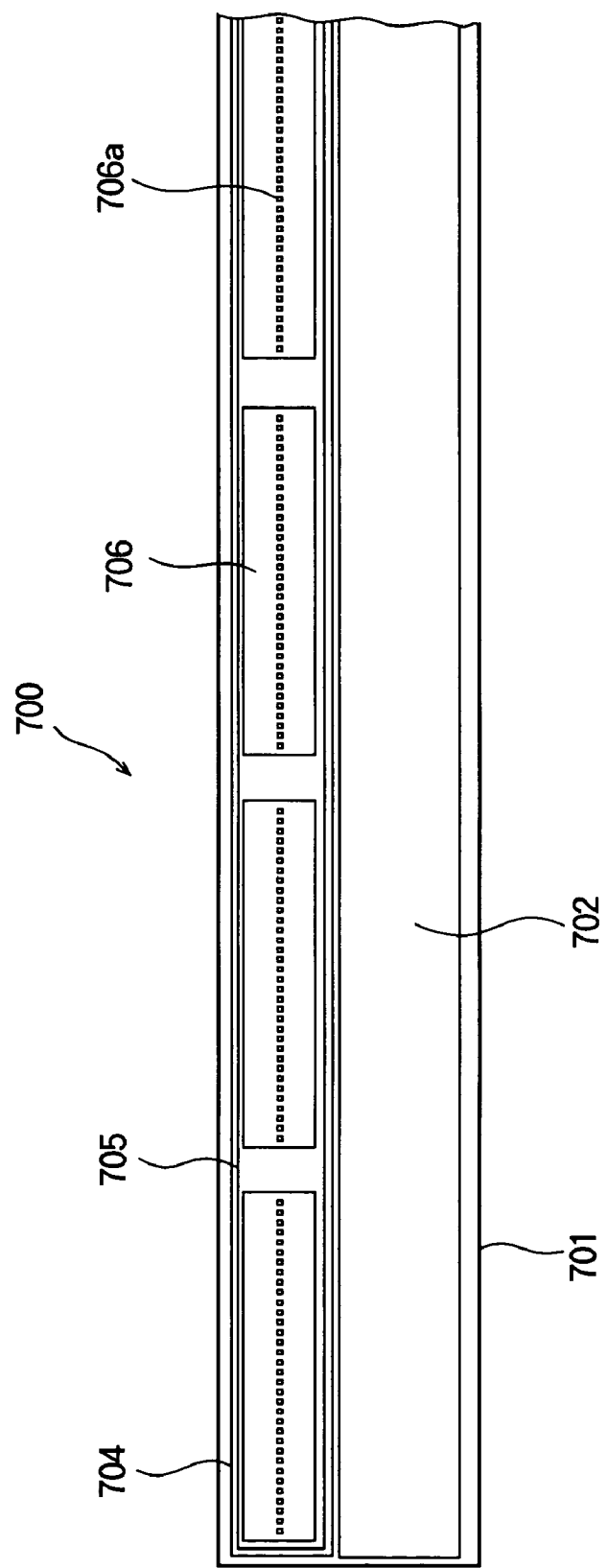
FIG. 18 is a plan view schematically showing a part of an integrated LED/driving-IC chip in accordance with a seventh embodiment of the present invention.
Figure 19:
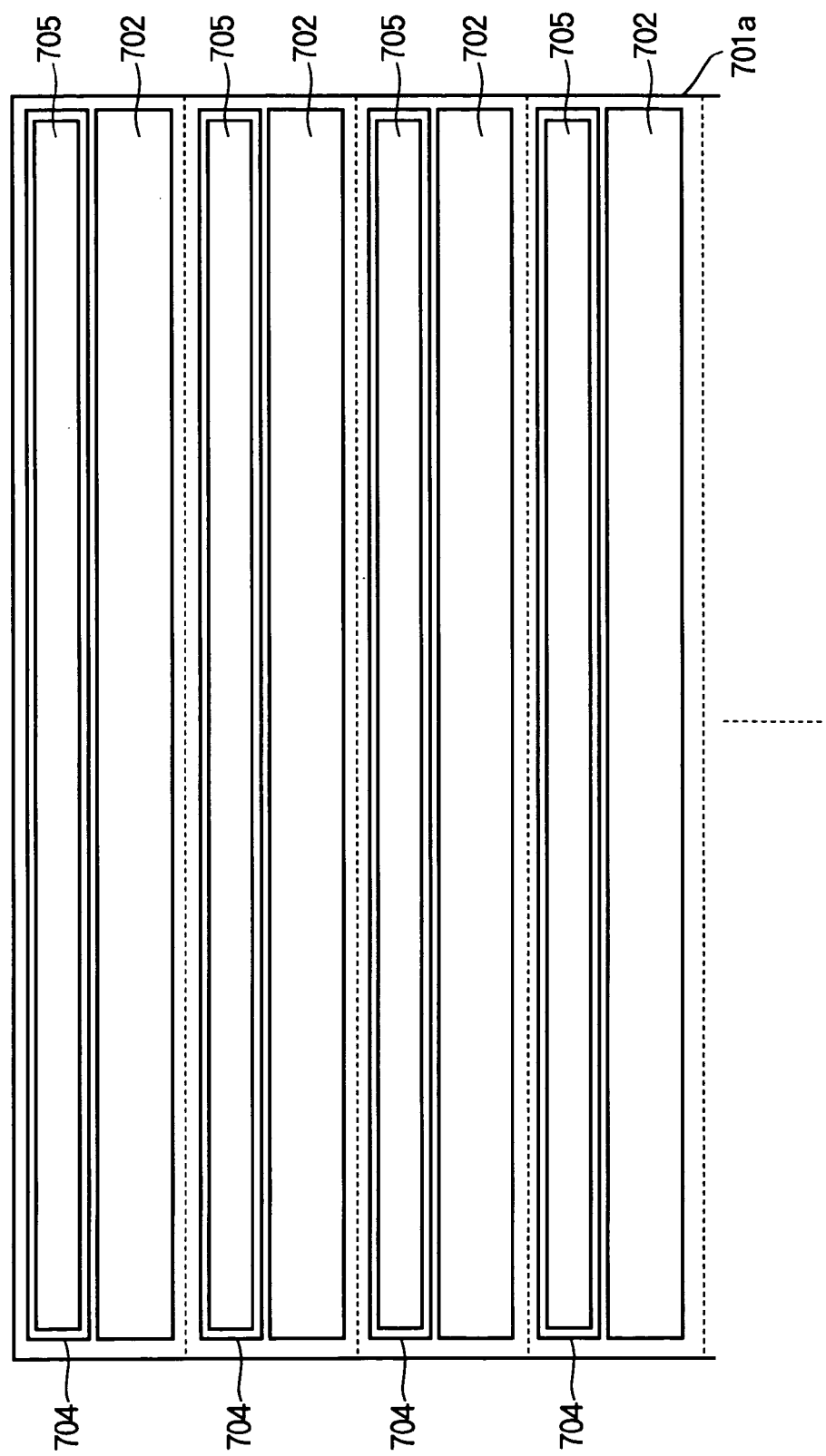
FIG. 19 is a schematic plan view for explaining a process of fabricating the integrated LED/driving-IC chip of the seventh embodiment.

FIG. 18 is a plan view schematically showing a part of an integrated LED/driving-IC chip 700 as a semiconductor apparatus in accordance with a seventh embodiment of the present invention, and FIG. 19 is a plan view for explaining a process of fabricating the integrated LED/driving-IC chip 700 of the seventh embodiment.

As shown in FIG. 18, the integrated LED/driving-IC chip 700 of the seventh embodiment includes an insulating substrate 701, an adhesion layer 704 formed on the insulating substrate 701 and made of semiconductor material as its main material, an electrically conductive layer 705 formed on the adhesion layer 704, a plurality of LEDs 706a, and LED epitaxial films 706 as sheet-like semiconductor thin films bonded on the electrically conductive layer 705. The integrated LED/driving-IC chip 700 also includes an integrated circuit device 702 formed on the insulating substrate 701 and including driving-ICs for the LEDs, and individual interconnecting layers (not shown) as thin films extending from the upper surfaces of the LEDs 706a via the upper surface of the insulating substrate 701 to individual terminal areas on the integrated circuit device 702. An interdielectric layer (not shown) is provided under the individual interconnecting layers as necessary.

The materials of the insulating substrate 701, adhesion layer 704, electrically conductive layer 705, LED epitaxial films 706, integrated circuit 702, individual interconnecting layers and interdielectric layer as well as how to form theses are the substantially the same as those in the foregoing first to sixth embodiments.

As has been described above, in the integrated LED/driving-IC chip 700 of the seventh embodiment, since the adhesion layer and integrated circuit can be formed in a common process, a positional relation between the adhesion layer and integrated circuit can be made accurate.

Further, since the plurality of electrically conductive layers can be selectively formed on the insulating substrate and the adhesion layer and integrated circuit can be selectively formed, the fabricating cost can be reduced to a large extent.

Eighth Embodiment

Figure 20:
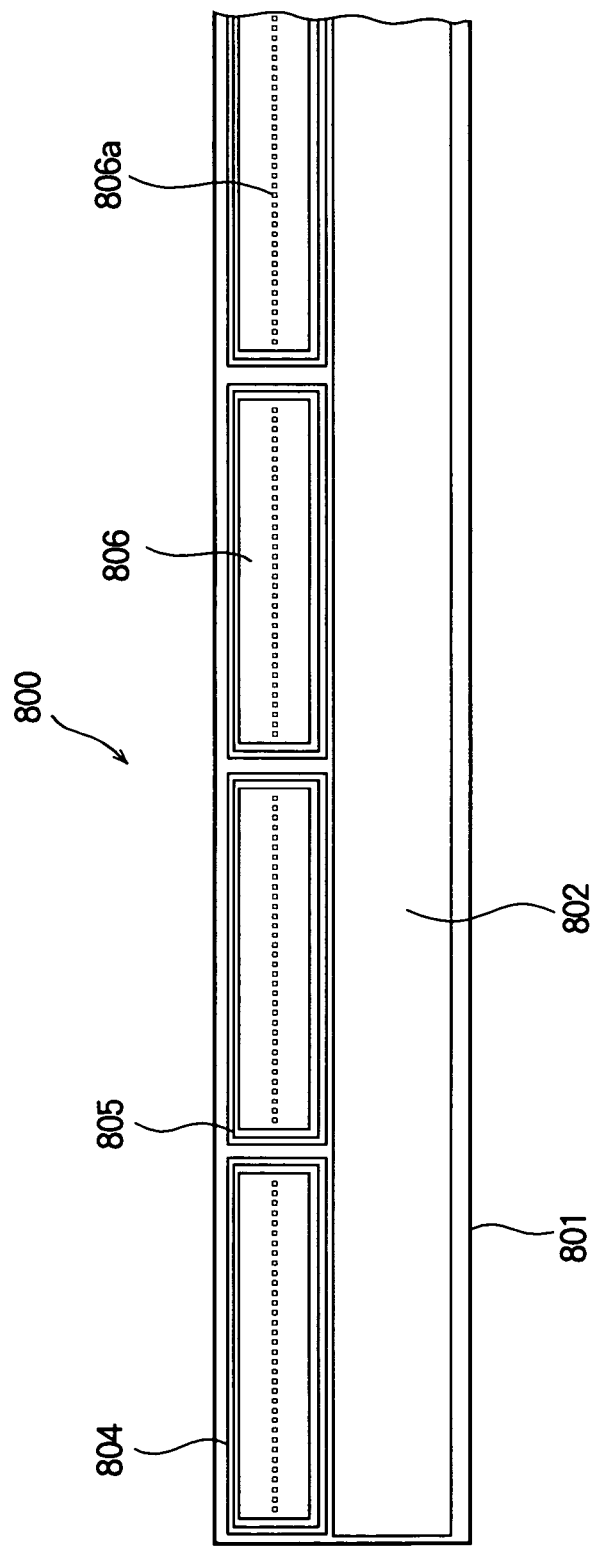
FIG. 20 is a plan view schematically showing a part of an integrated LED/driving-IC chip in accordance with an eighth embodiment of the present invention.

FIG. 20 is a plan view schematically showing a part of an integrated LED/driving-IC chip 800 as a semiconductor apparatus in accordance with an eighth embodiment of the present invention.

As shown in FIG. 20, the integrated LED/driving-IC chip 800 of the eighth embodiment includes an insulating substrate 801, a plurality of adhesion layers 804 formed on the insulating substrate 801 and made of semiconductor material as their main material, electrically conductive layers 805 formed on the plurality of associated adhesion layers 804, and LED epitaxial films 806 including a plurality of LEDs 806a as sheet-like semiconductor thin films bonded on the electrically conductive layers 805. The integrated LED/driving-IC chip 800 also includes a driver integrated circuit 802 formed on the insulating substrate 801, and individual interconnecting layers (not shown) as thin films extending from the upper surfaces of the LEDs 806a via the upper surface of the insulating substrate 801 to the upper surface of the integrated circuit device 802 having a group of driving-ICs. An interdielectric layer (not shown) is provided under the individual interconnecting layers as necessary.

The materials of the insulating substrate 801, adhesion layers 804, electrically conductive layers 805, LED epitaxial films 806, integrated circuit 802, individual interconnecting layers and interdielectric layer as well as how to form these are substantially the same as those in the foregoing first to seventh embodiments.

As has been described above, in the integrated LED/driving-IC chip 800 of the eighth embodiment, since the adhesion layer and integrated circuit can be formed in a common process, a positional relationship between the adhesion layer and integrated circuit can be made accurate.

Further, since the plurality of electrically conductive layers can be formed on the glass substrate in a common process, and the adhesion layers and integrated circuit can be formed in a single sequential process, the manufacturing cost can be reduced remarkably.

LED Print Head

Figure 21:
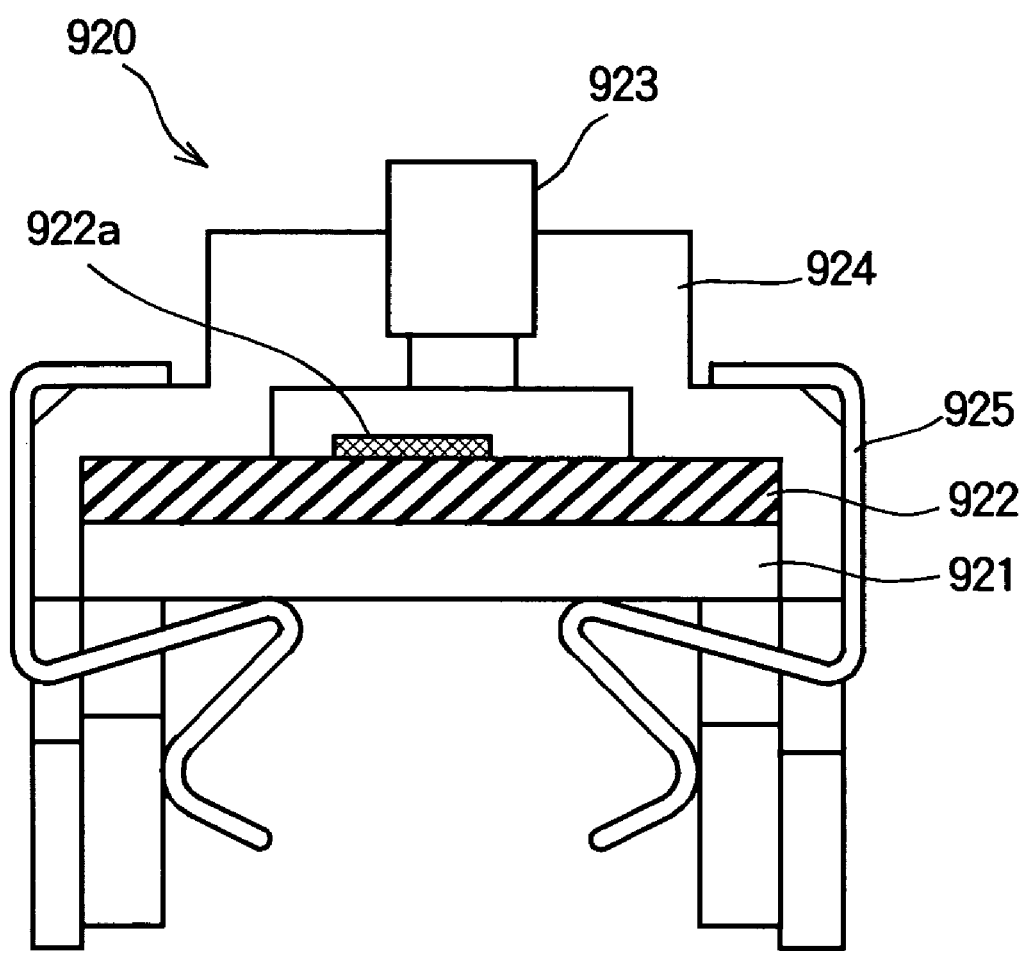
FIG. 21 is a schematic cross sectional view showing an LED print head equipped with a semiconductor apparatus of the present invention.

FIG. 21 is a schematic cross sectional view of an LED print head 920 having the semiconductor apparatus of the present invention built therein. As shown in FIG. 21, the LED print head 920 includes a base 921 on which an LED unit 922 is mounted. The LED unit 922 includes a plurality of integrated LED/driving-IC chips 922a of the type described in any of the preceding embodiments, mounted so that their light-emitting parts are positioned beneath a rod lens array 923. The rod lens array 923 is supported by a holder 924. The base 921, LED unit 922, and holder 924 are held together by clamps 925. Light emitted by the light-emitting elements in the LED unit 922 is focused by rod lenses in the rod lens array 923 onto, for example, a photosensitive drum (not shown) in an electrophotographic printer or copier.

Use of integrated LED/driving-IC chips 922a instead of the conventional paired LED array chips and driver IC chips enables the LED unit 922 to be reduced in size and reduces its assembly cost, as there are fewer chips to be mounted.

LED Printer

Figure 22:
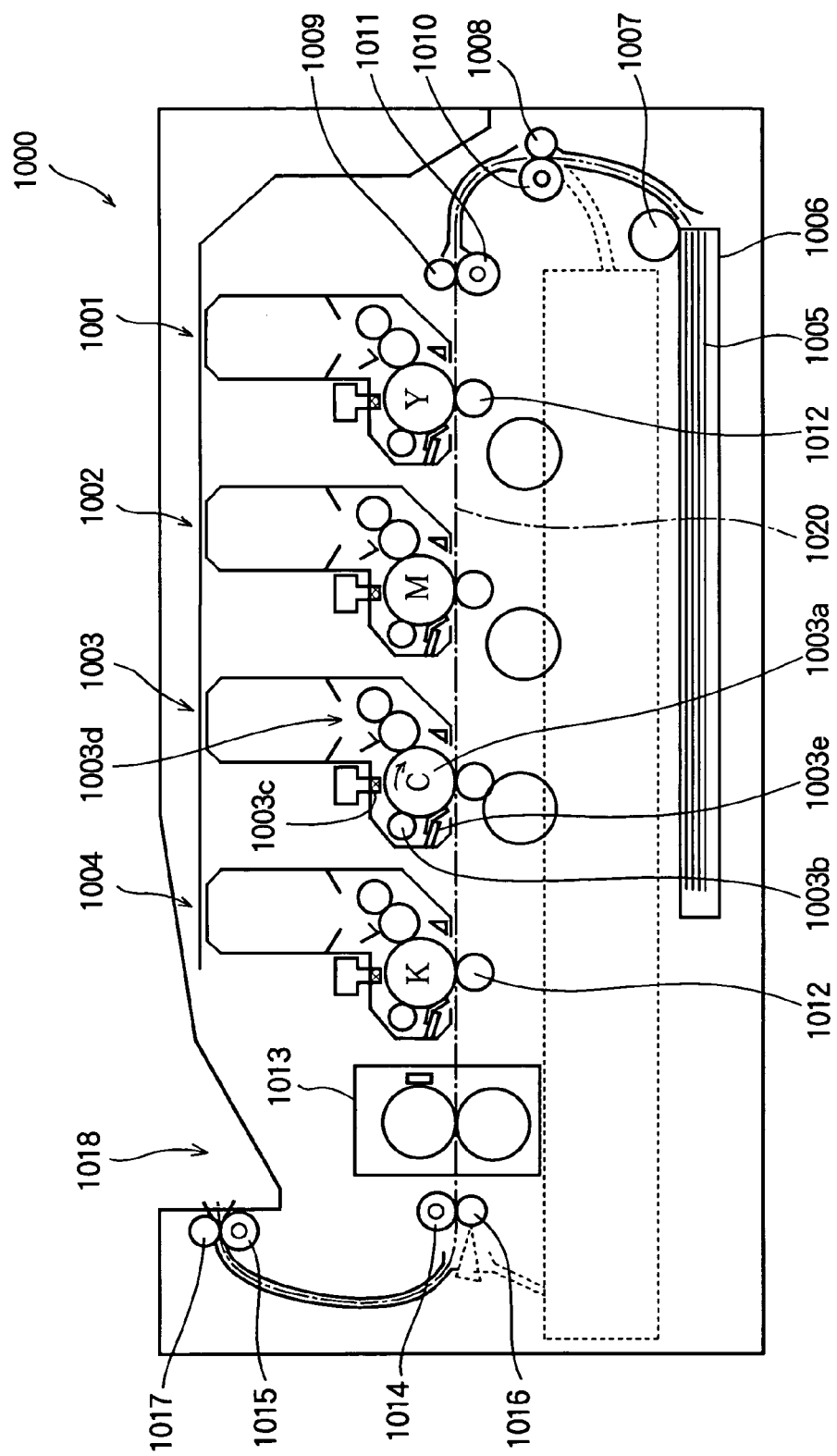
FIG. 22 is a schematic cutaway side view of an LED printer employing the invented semiconductor apparatus.
Figure 23:
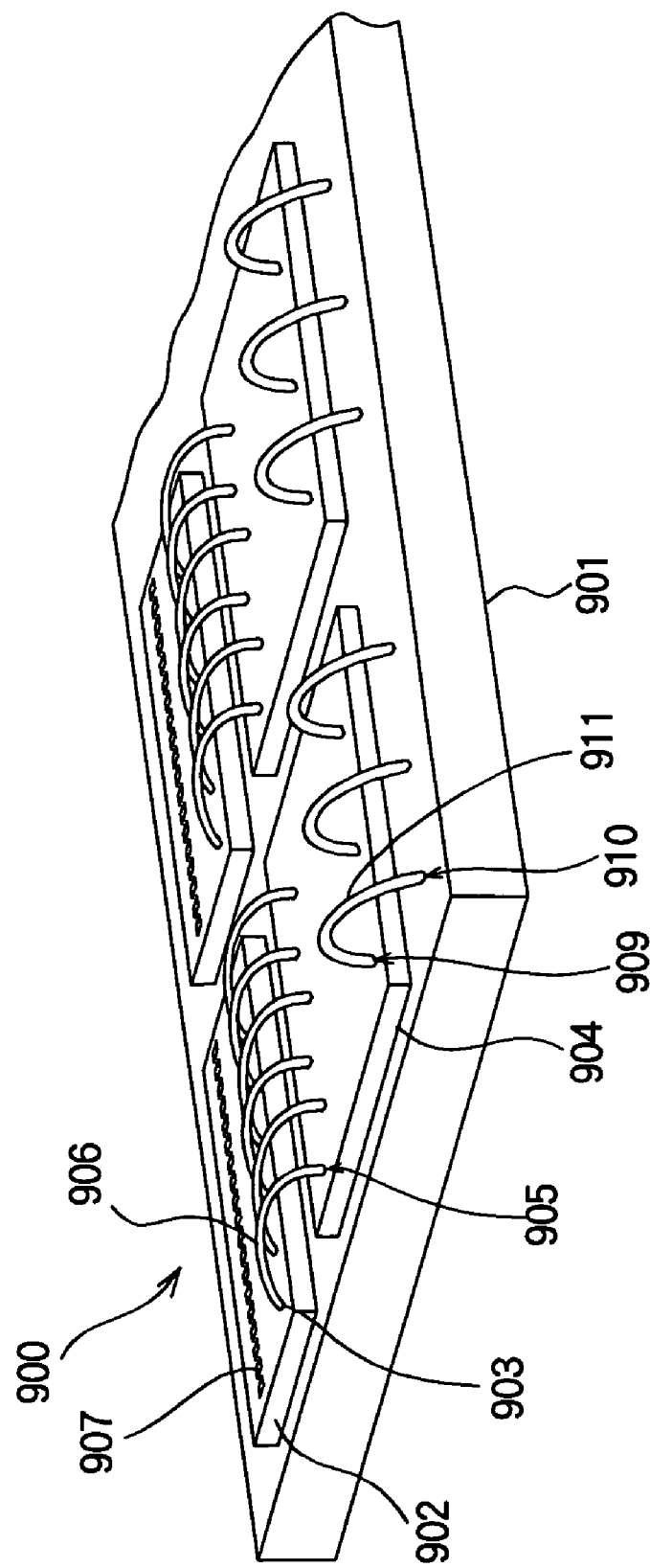
FIG. 23 is a perspective view schematically showing a part of a conventional LED print unit.
Figure 24:
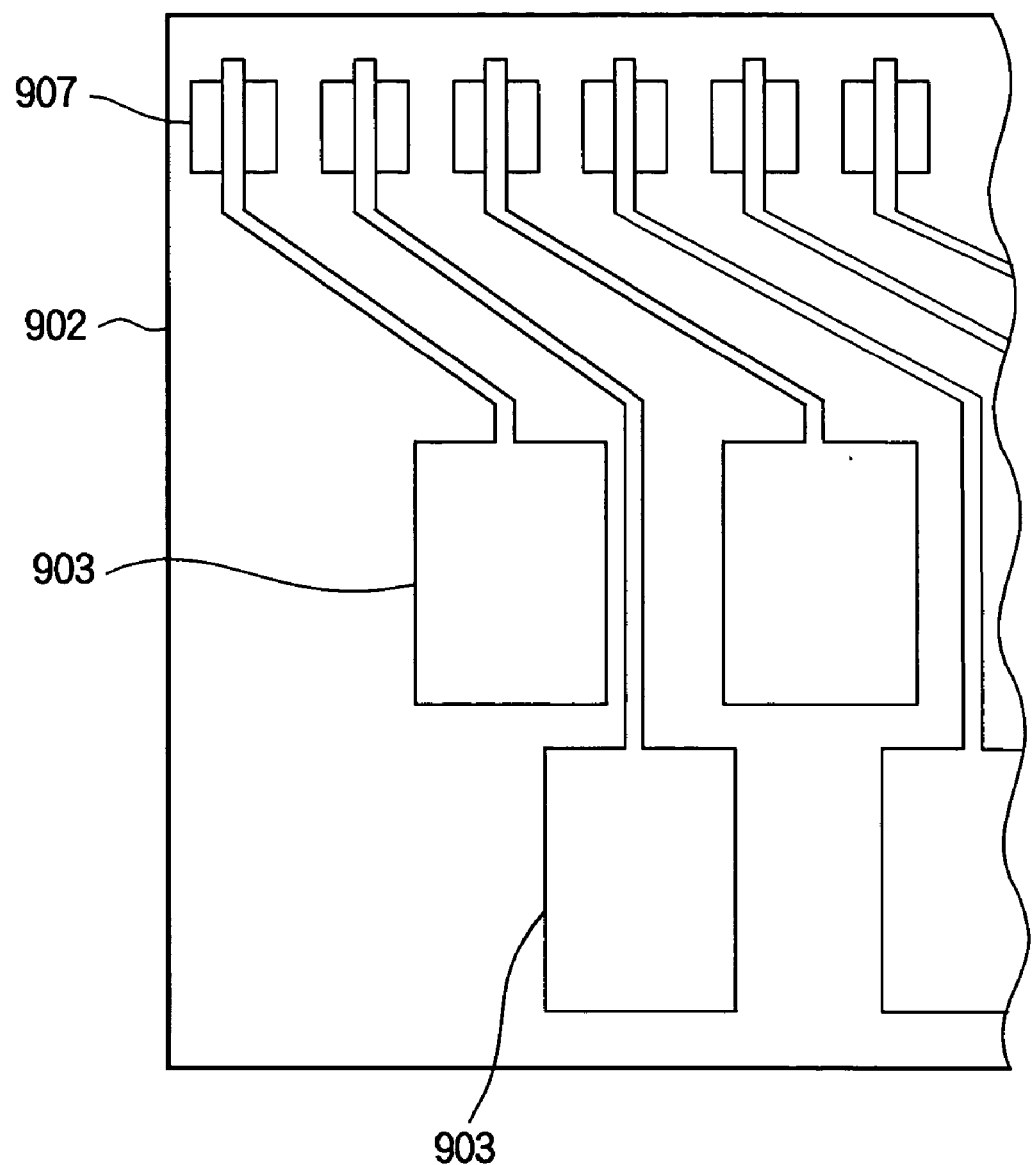
FIG. 24 is a plan view schematically showing a part of an LED array chip provided in the LED print unit of FIG. 23.

FIG. 22 shows an example of a full-color LED printer 1000 in which the present invention may be employed. The printer 1000 has a yellow (Y) process unit 1001, a magenta (M) process unit 1002, a cyan (C) process unit 1003, and a black (K) process unit 1004, which are mounted following one another in tandem fashion. The cyan process unit 1003, for example, includes a photosensitive drum 1003a that turns in the direction indicated by the arrow, a charging unit 1003b that supplies current to the photosensitive drum 1003a to charge the surface thereof, an LED print head 1003c that selectively illuminates the charged surface of the photosensitive drum 1003a to form an electrostatic latent image, a developing unit 1003d that supplies cyan toner particles to the surface of the photosensitive drum 1003a to develop the electrostatic latent image, and a cleaning unit 1003e that removes remaining toner from the photosensitive drum 1003a after the developed image has been transferred to paper. The LED print head 1003c has, for example, the structure shown in FIG. 21, including integrated LED/driving-IC chips 702a of the type described in any of the nine embodiments above. The other process units 1001, 1002, 1004 are similar in structure to the cyan process unit 1003, but use different toner colors.

The paper 1005 (or other media) is held as a stack of sheets in a cassette 1006. A hopping roller 1007 feeds the paper 1005 one sheet at a time toward a paired transport roller 1010 and pinch roller 1008. After passing between these rollers, the paper 1005 travels to a registration roller 1011 and pinch roller 1009, which feed the paper toward the yellow process unit 1001.

The paper 1010 passes through the process units 1001, 1002, 1003, 1004 in turn, traveling in each process unit between the photosensitive drum and a transfer roller 1012 made of, for example, semi-conductive rubber. The transfer roller 1012 is charged so as to create a potential difference between it and the photosensitive drum. The potential difference attracts the toner image from the photosensitive drum onto the paper 1005. A full-color image is built up on the paper 1005 in four stages, the yellow process unit 1001 printing a yellow image, the magenta process unit 1002 a magenta image, the cyan process unit 1003 a cyan image, and the black process unit 1004 a black image.

From the black process unit 1004, the paper 1005 travels through a fuser 1013, in which a heat roller and back-up roller apply heat and pressure to fuse the transferred toner image onto the paper. A first delivery roller 1014 and pinch roller 1016 then feed the paper 1005 upward to a second delivery roller 1015 and pinch roller 1017, which deliver the printed paper onto a stacker 1018 at the top of the printer.

The photosensitive drums and various of the rollers are driven by motors and gears not shown in the drawing. The motors are controlled by a control unit (not shown) that, for example, drives the transport roller 1010 and halts the registration roller 1011 until the front edge of a sheet of paper 1005 rests flush against registration roller 1011, then drives the registration roller 1011, thereby assuring that the paper 1005 is correctly aligned during its travel through the process units 1001, 1002, 1003, 1004. The transport roller 1010, registration roller 1011, delivery rollers 1014, 1015, and pinch rollers 1008, 1009, 1016, 1017 also have the function of changing the direction of travel of the paper 1005.

The LED heads account for a significant part of the manufacturing cost of this type of LED printer 1000. By using highly reliable and space-efficient integrated LED/driving-IC chips and enabling these chips and the LED units in the LED heads to be manufactured by a simplified fabrication process with reduced material costs, the present invention enables a high-quality printer to be produced at a comparatively low cost.

Similar advantages are obtainable if the invention is applied to a full-color copier. The invention can also be advantageously used in a monochrome printer or copier or a multiple-color printer or copier, but its effect is particularly great in a full-color image-forming apparatus (printer or copier), because of the large number of exposure devices (print heads) required in such apparatus.

Modifications of Embodiments

In the foregoing embodiments, explanation has been made in connection with the case where the electrically conductive layer is provided on the adhesion layer. However, the electrically conductive layer may be made of such electrically conductive oxide material as polysilicon, electrically conductive oxide (ITO, ZnO), or the like.

Although explanation has been made in the foregoing embodiments in the connection with the case where the LED epitaxial films are bonded on the Si substrate, the material of the substrate may be replaced not only by amorphous silicon, single crystalline silicon or polysilicon but also by other material such as compound semiconductor, organic semiconductor or insulating material (glass, sapphire or the like).

Although explanation has been made in the foregoing embodiments in connection with the case where the semiconductor devices are provided in the semiconductor thin films, the semiconductor device may be replaced by another light-emitting element such as a laser, a light-sensing element, a Hall element or a piezoelectric element.

Although explanation has been made in the foregoing embodiments in connection with the case where the LED epitaxial films are epitaxial layers, a semiconductor thin film other than the LED epitaxial film may be employed in the integrated LED/driving-IC chip.

What is claimed is:

1. A semiconductor apparatus comprising:
   substrate;
   an adhesion layer disposed on said substrate, said adhesion layer mainly consisting of semiconductor material;
   at least one semiconductor thin film including at least one semiconductor device, said at least one semiconductor thin film being bonded on said adhesion layer;
   an individual interconnecting layer extending from an upper surface of said semiconductor thin film to an upper surface of a terminal area of said integrated circuit so that said semiconductor device and said integrated circuit are electrically connected to each other; and
   a second interdielectric layer which electrically isolates said individual interconnecting layer from said semiconductor thin film and a part of said substrate.

2. The semiconductor apparatus according to claim 1, wherein said second interdielectric layer including at least one of a silicon oxide film and a silicon nitride film.

3. The semiconductor apparatus according to claim 2, further comprising:
   at least one semiconductor thin film including at least one semiconductor device, said at least one semiconductor thin film being bonded on said adhesion layer; and
   an electrically conductive layer disposed between said adhesion layer and said semiconductor thin film.

4. The semiconductor apparatus according to claim 1 further comprising:
   an individual interconnecting layer extending from an upper surface of said semiconductor thin film to an upper surface of said substrate; and
   an electrode pad disposed on said first interdielectric layer disposed between said substrate and said adhesion layer, said electrode pad being electrically connected to said individual interconnecting layer.

5. A semiconductor apparatus comprising:
   a substrate;
   an adhesion layer disposed on said substrate, said adhesion layer mainly consisting of semiconductor material; and
   at least one semiconductor thin film including at least one semiconductor device, said at least one semiconductor thin film being bonded on said adhesion layer;
   wherein a number of said at least one semiconductor device formed in said semiconductor thin film is one, number of said at least one semiconductor film is plural, and a plurality of said semiconductor thin films are arranged on said adhesion layer at regular intervals.

6. A semiconductor apparatus comprising:
   a substrate;
   at least one semiconductor thin film including at least one semiconductor device; and
   an adhesion layer disposed on said substrate, said adhesion layer mainly consisting of semiconductor material, a main constituent of said adhesion layer being different from main constituent of said at least one semiconductor thin film, said semiconductor material having an affinity to both of said at least one semiconductor thin film and said substrate;
   said at least one semiconductor thin film being bonded on said adhesion layer;
   wherein said semiconductor device is any of a light-emitting element, a light-sensing element, a Hall element, and a piezoelectric element.

7. The semiconductor apparatus according to claim 6, wherein a number of said at lease one semiconductor device is plural, and a plurality of said semiconductor devices are arranged in said semiconductor thin film at regular intervals.

8. The semiconductor apparatus according to claim 6, wherein said substrate is a semiconductor substrate including an integrated circuit which includes a plurality of circuit elements.

9. The semiconductor apparatus according to claim 8, wherein said semiconductor thin film is disposed on a region of said substrate adjacent to a region in which said integrated circuit is formed.

10. The semiconductor apparatus according to claim 8, wherein said semiconductor thin film is disposed on a region of said substrate in which said integrated circuit is formed.

11. The semiconductor apparatus according to claim 6, wherein said substrate is an insulating substrate.

12. The semiconductor apparatus according to claim 6, wherein said adhesion layer is any of a polycrystalline silicon layer and an amorphous silicon layer;
wherein said semiconductor thin film is a compound semiconductor thin film;
wherein a main constituent of said substrate is different from a main constituent of said semiconductor thin film.

13. The semiconductor apparatus according to claim 6, wherein said semiconductor thin film is a compound semiconductor thin film.

14. An optical print head including the semiconductor apparatus of claim 6.

15. An optical print head including the semiconductor apparatus of claim 6, wherein the semiconductor device in the thin semiconductor film in the semiconductor apparatus is a light-emitting element, the semiconductor apparatus including a plurality of such light-emitting elements, the optical print head further including:
a base for supporting the semiconductor apparatus;
a rod lens array for focusing the light emitted by the light-emitting elements in the semiconductor apparatus;
a holder for holding the rod lens array; and
at least one clamp for holding the base and the bolder together.

16. An image-forming apparatus comprising at least one optical print head including the semiconductor apparatus of claim 6.

17. The image-forming apparatus of claim 16, further comprising:
a photosensitive drum selectively illuminated by the optical printing head to form a latent electrostatic image.

18. The image-forming apparatus of claim 17, further comprising:
a developing unit for supplying toner to develop the latent electrostatic image on the photosensitive drum; and
a transfer roller for transferring the developed image from the photosensitive drum to printing media.

* * * * *